(12) United States Patent
Ho et al.

(10) Patent No.: US 9,413,341 B1
(45) Date of Patent: Aug. 9, 2016

(54) ELECTRO-MECHANICAL VOLTAGE-CONTROLLED OSCILLATOR AND A METHOD FOR GENERATING TUNABLE BALANCED OSCILLATIONS

(71) Applicant: PMC-SIERRA US, INC., Sunnyvale, CA (US)

(72) Inventors: Stanley Ho, Richmond (CA); Hormoz Djahanshahi, Port Moody (CA)

(73) Assignee: Microsemi Storage Solutions (U.S.), Inc., Aliso Vejio, CA (US)

( * ) Notice: Subject to any disclaimer, the term of this patent is extended or adjusted under 35 U.S.C. 154(b) by 0 days.

(21) Appl. No.: 14/335,842

(22) Filed: Jul. 18, 2014

Related U.S. Application Data

(60) Provisional application No. 61/919,873, filed on Dec. 23, 2013.

(51) Int. Cl.
*H03K 3/36* (2006.01)
*H03K 3/356* (2006.01)

(52) U.S. Cl.
CPC ............ *H03K 3/356104* (2013.01); *H03K 3/36* (2013.01)

(58) Field of Classification Search
CPC ....... H03L 5/00; H03K 3/356104; H03K 3/36
USPC .......... 331/116 R, 116 FE, 154, 158
See application file for complete search history.

(56) References Cited

U.S. PATENT DOCUMENTS

| | | | |
|---|---|---|---|
| 6,696,899 B2 | 2/2004 | Ruffieux | |
| 6,828,844 B2 | 12/2004 | Suzuki et al. | |
| 6,956,443 B2 | 10/2005 | Ruffieux | |
| 7,019,598 B2 | 3/2006 | Duncan et al. | |
| 7,123,109 B2 | 10/2006 | Stevenson et al. | |
| 7,170,357 B1 * | 1/2007 | Driscoll et al. | 331/158 |
| 7,312,672 B2 | 12/2007 | Yamamoto | |
| 7,362,193 B2 | 4/2008 | Mattisson | |
| 7,482,888 B1 | 1/2009 | Kleveland | |
| 7,545,229 B2 | 6/2009 | Rohde et al. | |
| 8,040,190 B2 | 10/2011 | Ruffieux | |
| 8,519,800 B1 * | 8/2013 | Wagner et al. | 331/116 R |
| 2006/0049883 A1 | 3/2006 | Mattisson | |

(Continued)

OTHER PUBLICATIONS

Hu et al., "A 50ppm 600MHz Frequency Reference Utilizing the Series Resonance of an FBAR" IEEE Radio Frequency Integrated Circuits Symposium, 2010, pp. 325-328.

(Continued)

*Primary Examiner* — Jeffrey Shin
(74) *Attorney, Agent, or Firm* — Dennis R. Haszko

(57) ABSTRACT

A cross-coupled complementary balanced voltage-controlled oscillator and a method for operating same. The oscillator comprises an electro-mechanical resonator, and an oscillator core. The oscillator core comprises capacitively cross-coupled complementary inverters and a resistor network. The oscillator may comprise a frequency tuning network having inductors for increasing the tuning range. The capacitance inhibit the inverters from latching to a static direct current state. The resistor network forms a high pass filter with the capacitance to inhibit relaxation oscillations. The method comprises enabling the resistor network to form a high pass filter and starting balanced oscillations in the oscillator, the capacitance of the high pass filter for inhibiting latching, and the high pass filter for inhibiting relaxation oscillations. The method may comprise tuning the frequency by varying the capacitance of the oscillator.

25 Claims, 19 Drawing Sheets

(56) References Cited

U.S. PATENT DOCUMENTS

2009/0039970 A1* 2/2009 Shen et al. .................... 331/158
2011/0291767 A1* 12/2011 Ishikawa et al. .............. 331/154
2014/0070897 A1* 3/2014 Brekelmans et al. ......... 331/109

OTHER PUBLICATIONS

Ruffieux, "A High-Stability, Ultra-Low-Power Differential Oscillator Circuit for Demanding Radio Applications", Proc. of European Solid-States Circuit Conference, 2002, pp. 85-88.

Shi et al., "A Sub-100uW 2GHz Differential Colpitts CMOS/FBAR VCO" IEEE Custom Integrated Circuits Conference, 2011, pp. 4 pages.

Westra et al., "Resonance-Mode Selection and Crosstalk Elimination Using Resonator-Synchronised Relaxation Oscillators", Proc. of European Solid-States Circuit Conference, 1998, 4 pages.

U.S. Appl. No. 13/909,739, Office Action dated Sep. 19, 2014, 14 pages.

U.S. Appl. No. 13/909,739, Notice of Allowance dated Feb. 23, 2015, 5 pages.

* cited by examiner

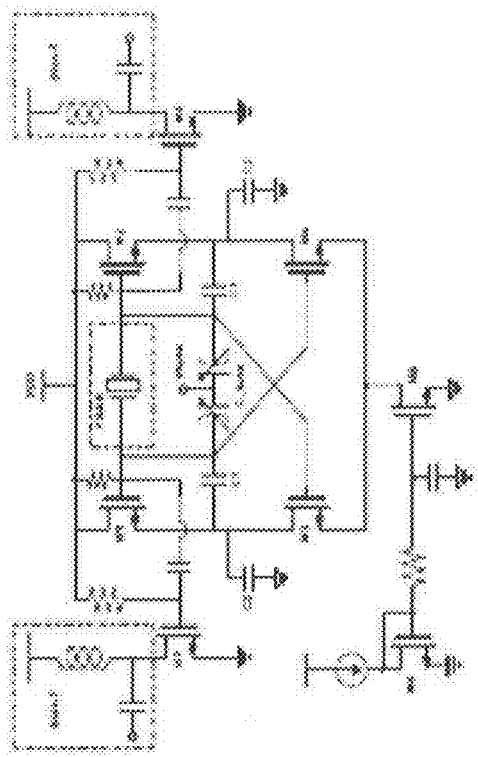
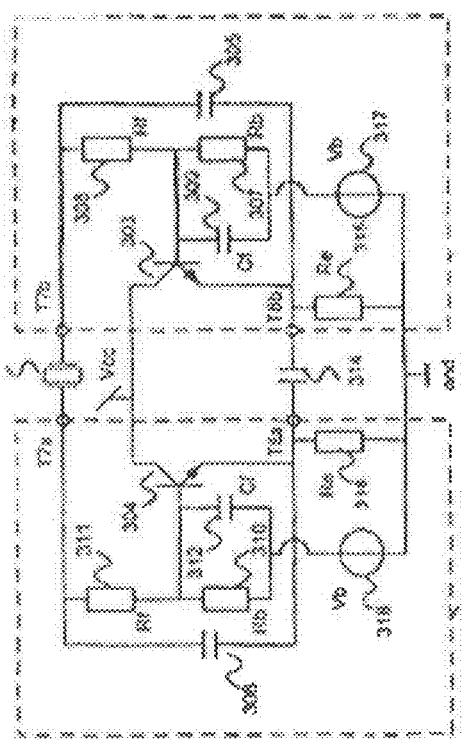
FIG. 5B
FIG. 5A
(Prior Art)

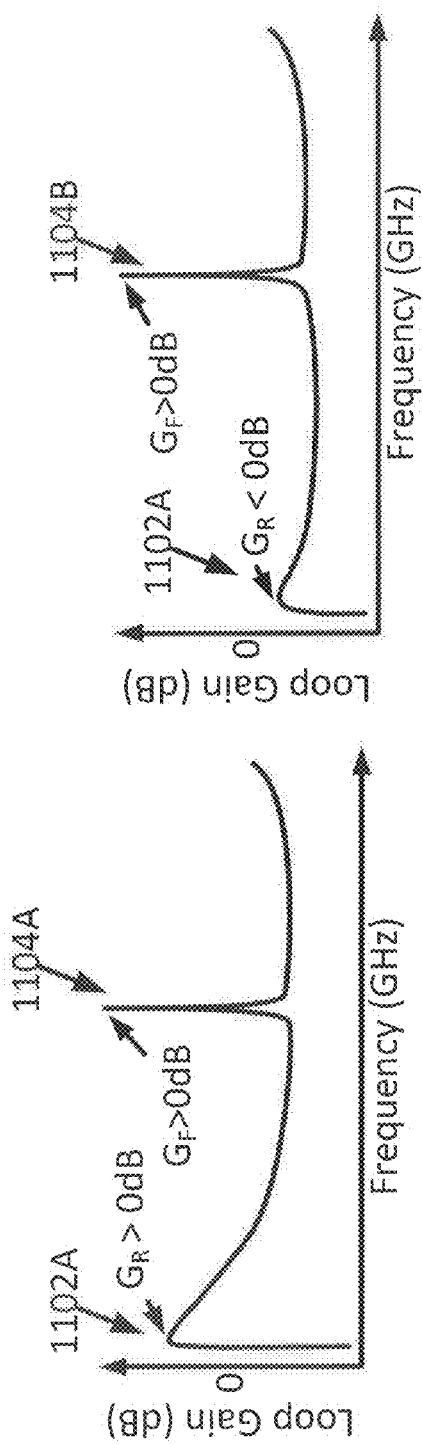
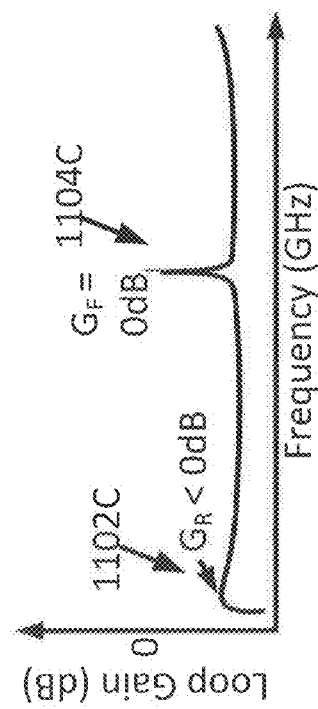
FIG. 11A
FIG. 11B
FIG. 11C

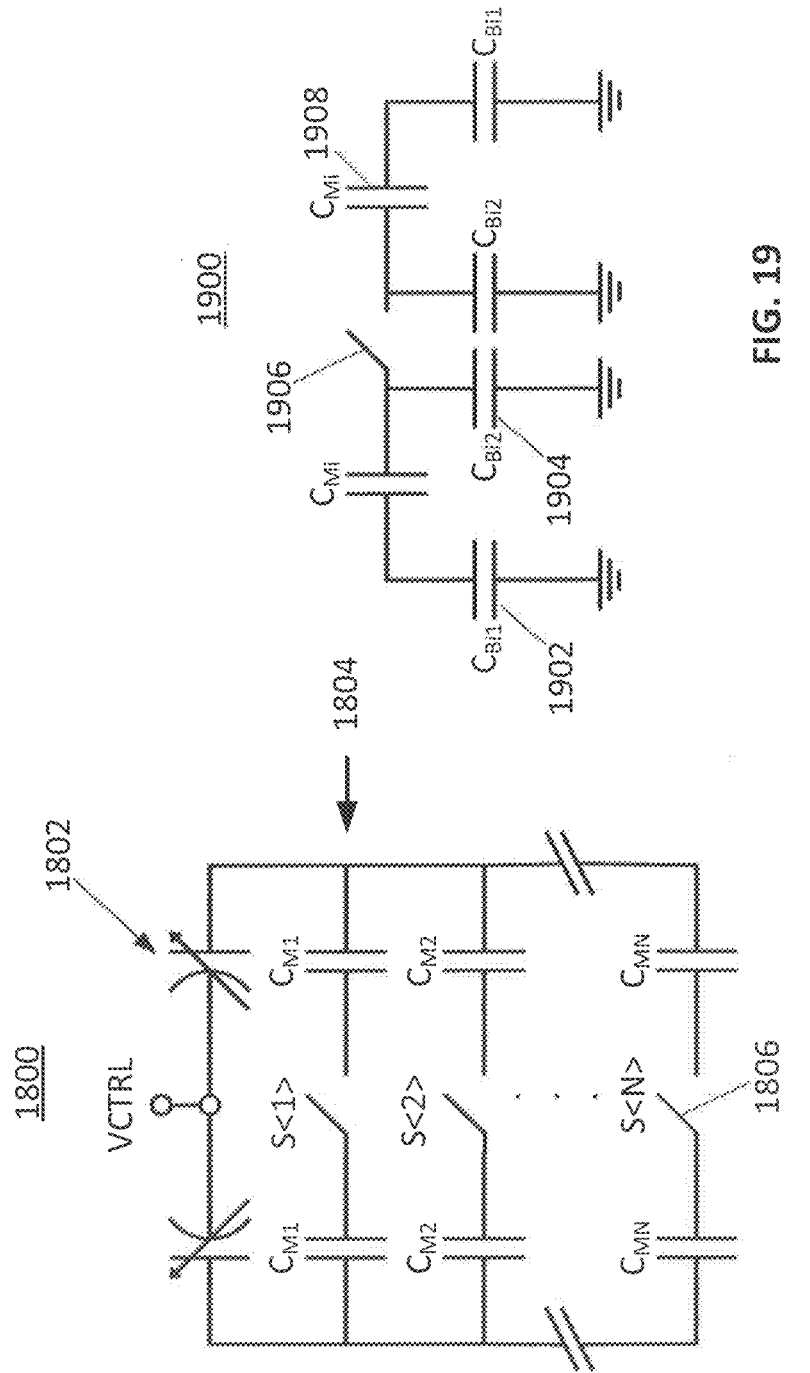

ELECTRO-MECHANICAL VOLTAGE-CONTROLLED OSCILLATOR AND A METHOD FOR GENERATING TUNABLE BALANCED OSCILLATIONS

FIELD

The present disclosure relates to the field of oscillators. More particularly, the present disclosure relates to balanced oscillators using an electro-mechanical resonator.

BACKGROUND

Oscillators are electrical devices that generate an oscillating or repetitive signal. The signal comprises a voltage which varies in magnitude and sign over time. The signal can be a sinusoidal wave, such as in an analog signal, or a square wave, such as in a digital electronic signal. Signals generated by an oscillator, especially electronic signals, have a number of applications such as, for example, a precise reference clock source in a voltage-controlled oscillator for frequency tuning, as a reference lock source in a phase-locked loop (PLL) for locking onto another signal, or a frequency synthesizer to generate many other frequency references required in specific applications including microprocessors, wireline (tethered) or wireless communication systems, and application-specific integrated circuits (ASICs).

Oscillators comprise a resonator and an oscillator core. The resonator creates the oscillations and the oscillator core provides power to the resonator to initiate and sustain oscillations. A resonator can be, for example, an inductor-capacitor (LC) resonator or an electro-mechanical resonator. LC resonators comprise an inductor and a fixed capacitor. A variable capacitor can also be added to an LC resonator to tune the frequency of oscillations produced by the LC resonator and oscillator. The use of an electro-mechanical resonator, such as a piezoelectric resonator, in place of an LC resonator can improve the quality (phase purity) of the oscillations in an oscillator. The quality factor of a resonator determines how under-damped its oscillator is—the higher the quality factor, the lower the rate of energy loss relative to the stored energy of the resonator. LC resonators in an integrated circuit (IC), for example, have a quality factor between 5 and 25. The quality factor of an electro-mechanical resonator can be 10 to 100 times higher than that of an integrated LC resonator.

When an electro-mechanical resonator is used with a differential oscillator, that has a common-source cross-coupled transistor oscillator core, to produce balanced oscillations, however, issues are introduced with respect to the oscillator latching to a static direct current (DC) state. Unlike an LC resonator, an electro-mechanical resonator has a very high impedance at low frequency and acts like an open circuit at DC. Although not an issue for single-ended oscillators, the high impedance at DC causes the cross-coupled transistors in a differential oscillator to become a latch with a very high DC gain so as to prevent the oscillations from starting in the oscillator. Accordingly, electro-mechanical resonators are commonly used in three-point oscillator topologies, such as Colpitts, Pierce, and Hartley oscillators, which do not suffer from the latching problem. A three-point oscillator, however, only provides a single-ended output signal, not a differential output signal. The differential output signals, as produced by a cross-coupled oscillator, have a better common-mode noise rejection and an increased oscillation swing across the resonator as compared to the single-ended output signal.

One known approach to address the latching issue is to place a capacitor at the source of cross-coupled NMOS transistors. This breaks the loop formed by the transistors and the resonator at DC, while closing the loop as desired at high frequencies. This approach, however, cannot be used with cross-coupled complementary oscillators comprising a pair of NMOS and PMOS transistors. There are advantages to using complementary cross-coupled inverters in an oscillator such as, for example, boosting transconductance ($g_m$) and improving phase noise. Furthermore, the approach of placing a capacitor at the source requires more design effort to ensure stability because it does not unconditionally inhibit unwanted parasitic relaxation oscillations from occurring in the oscillator. Adding capacitors also causes some amount of decrease in signal swing and phase noise performance of the oscillator. Whether relaxation oscillations occur depends on the resistance and capacitance values in the DC blocking path in the oscillator. Stability analysis can be performed to determine the largest capacitor possible to avoid relaxation oscillations, but at the expense of lower signal swing and worse phase noise performance, as well as increased design complexity. Accordingly, it would be desirable to have a cross-coupled complementary oscillator comprising an electro-mechanical resonator that does not latch to DC or experience relaxation oscillations.

Furthermore, when an electro-mechanical resonator is used in a voltage-controlled oscillator, issues are introduced with respect to the tuning range. Specifically, the oscillator has a narrow tuning range due to the maximum-to-minimum capacitance ratio. Accordingly, it would also be desirable to have a voltage-controlled oscillator comprising an electro-mechanical resonator with an extended tuning range.

BRIEF DESCRIPTION OF THE DRAWINGS

FIGS. 5A and 5B show Colpitts differential oscillators having an electro-mechanical resonator.

FIGS. 11A-C show the open loop gain in decibels (dB) versus frequency (GHz) for various configurations of the oscillator of FIG. 6.

FIG. 18 shows a capacitor bank of the oscillator of FIG. 6.

FIG. 19 shows a branch of the capacitor bank of FIG. 18.

DETAILED DESCRIPTION

This disclosure describes a cross-coupled complementary balanced voltage controlled oscillator and a method for generating tunable oscillations. The oscillator produces a balanced or differential signal. The oscillator comprises an electro-mechanical resonator and an oscillator core. The oscillator may comprise a frequency tuning network. The oscillator core comprises capacitively cross-coupled complementary inverters, with capacitors connected to the outputs of the inverters, and a resistor network. The capacitors inhibit the inverters from latching to a static direct current (DC) state. The resistor network, when connected to the oscillator, forms a high pass filter with the capacitors to inhibit relaxation oscillations. The method comprises starting balanced oscillations in the oscillator, inhibiting latching to a DC state using a capacitance, and inhibiting relaxation oscillations using a high pass filter. The method may also comprise tuning the frequency of the balanced oscillations.

Other aspects and features of the present disclosure will become apparent to those ordinarily skilled in the art upon review of the following description of specific embodiments in conjunction with the accompanying figures.

Before discussing these embodiments in detail, a more detailed description of known approaches is provided.

Figure 1C:
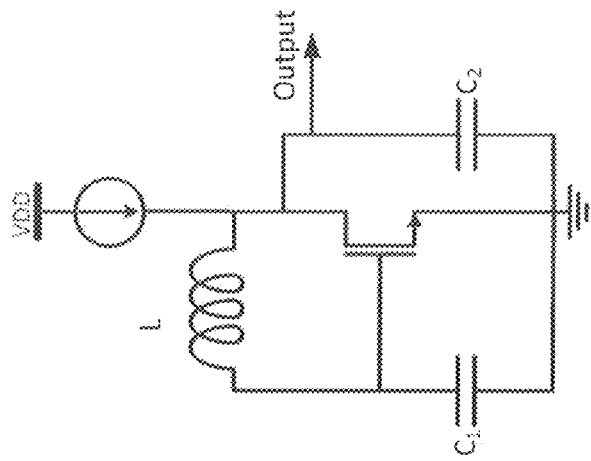
FIG. 1C shows a Pierce oscillator similar to the oscillator shown in FIG. 1A with an inductor in place of a piezoelectric resonator.
Figure 1B:
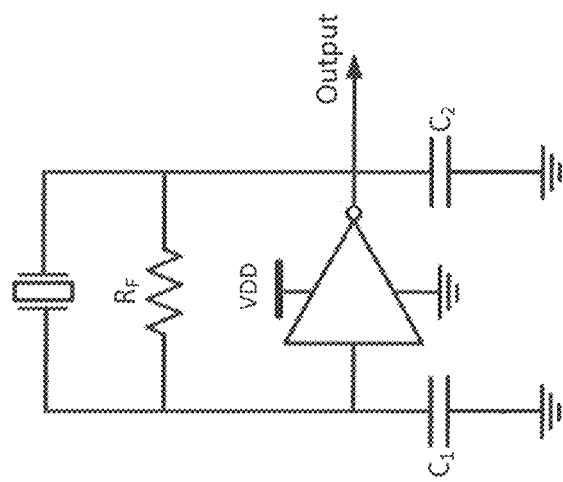
FIG. 1B shows an inverter based Pierce oscillator similar to the oscillator shown in FIG. 1A.
Figure 1A:
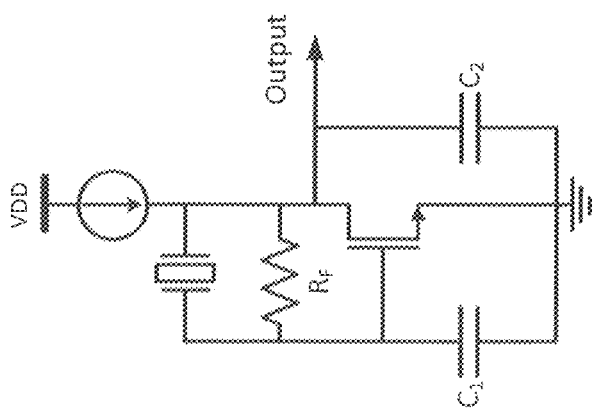
FIG. 1A shows a Pierce oscillator with a single transistor and a piezoelectric resonator.

FIGS. 1A-C show single-ended oscillators. FIG. 1A shows a Pierce oscillator with a single transistor and a piezoelectric resonator. A feedback resistor ($R_F$) determines a bias point. The feedback resistor is sufficiently large to not impact the oscillator during operation. Capacitors $C_1$ and $C_2$, together with the piezoelectric resonator determine the phase shift necessary to cause oscillations in the oscillator. The transistor starts and maintains oscillations in the oscillator by providing loop gain and hence replenishing energy loss (e.g. losses from the resonator, capacitor, and/or interconnections) due to the finite Q of the resonator. The gain and phase conditions to sustain oscillation are collectively known as Barkhausen criteria. FIG. 1B shows a Pierce oscillator similar to the oscillator shown in FIG. 1A, the difference being that the current source is replaced with a PMOS transistor. The PMOS transistor's gate is connected to the gate of the NMOS transistor to create a CMOS inverter with $g_m$-boost. FIG. 1C shows an oscillator similar to the oscillator shown in FIG. 1A, the difference being that the oscillator uses an inductor instead of the piezoelectric resonator. The feedback resistor is not required because the inductor provides the DC bias path for the transistor input. The Q factor of the inductor is much smaller than that of the piezoelectric resonator in FIGS. 1A and 1B.

A balanced or differential oscillator can provide oscillations with less phase noise, better clock symmetry, and better common-mode noise immunity than oscillations from a single-ended oscillator.

Figure 2C:
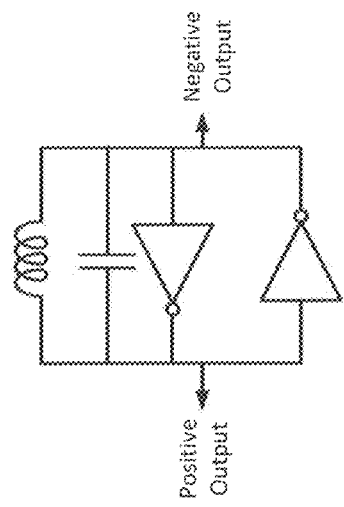
FIG. 2C shows an alternate embodiment of the differential LC oscillator shown in FIG. 2B
Figure 2B:
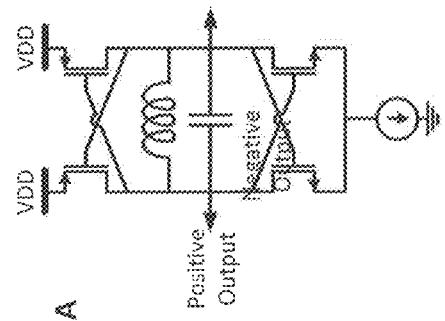
FIG. 2B shows a differential LC oscillator similar to the oscillator of FIG. 2A.
Figure 2A:
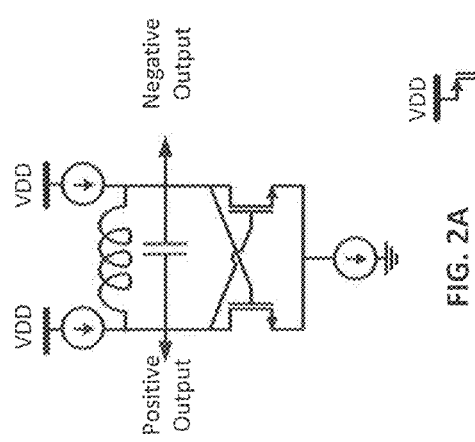
FIG. 2A shows a differential LC oscillator with two Pierce oscillators.

FIGS. 2A-C show differential or cross-coupled oscillators having an LC resonator. FIG. 2A shows a differential LC oscillator with two Pierce oscillators, similar to as shown in FIG. 1C, in a back-to-back configuration. The transistors are cross-coupled to one another and, accordingly, this type of oscillator is also known as a cross-coupled oscillator or negative-$g_m$ oscillator. The oscillator also has a common-source. FIG. 2B shows a differential LC oscillator similar to the oscillator of FIG. 2A, the difference being that the oscillator also has a pair of cross-coupled PMOS transistors. This type of oscillator is known as a cross-coupled complementary oscillator. Since the oscillator has $g_m$-boost and symmetric circuitry, it achieves a higher oscillation swing and better phase-noise performance as compared to the oscillator of FIG. 2A. The oscillator is typically used in systems-on-chips for different applications because of its high performance and easy on-chip integration, which allows for compact implementations. FIG. 2C shows an alternate embodiment of the differential LC oscillator shown in FIG. 2B, the difference being that it does not have a tail current source.

A differential oscillator comprising an electro-mechanical resonator, however, has a very high open-loop DC gain which can cause the oscillator to latch to static DC levels to prevent oscillations. Specifically, at DC where the oscillation frequency f is equal to 0, the resonator is capacitive and has infinite impedance. The oscillator reduces simply into a back-to-back inverter (a.k.a. flywheel) configuration where the positive feedback of the flywheel amplifies the noise or mismatch so that the output will latch to static voltage levels, namely, the voltage level of the supply rails. As a result, this type of oscillator circuit cannot "self-start" the oscillation. This is unlike an LC resonator based cross-coupled oscillator where at DC the parallel LC resonator is essentially a short circuit. The short circuit is due to the inductor, which suppresses the DC gain. The prior art attempts to address the described start-up problem with electro-mechanical resonators by adding one or more components such as DC block(s), feedback loops, and second resonators. These components add extra cost and complexity to the oscillator, reduce signal swing, degrade noise performance, and push the DC latch problem to a higher frequency so as to cause relaxation oscillations.

Figure 3B:
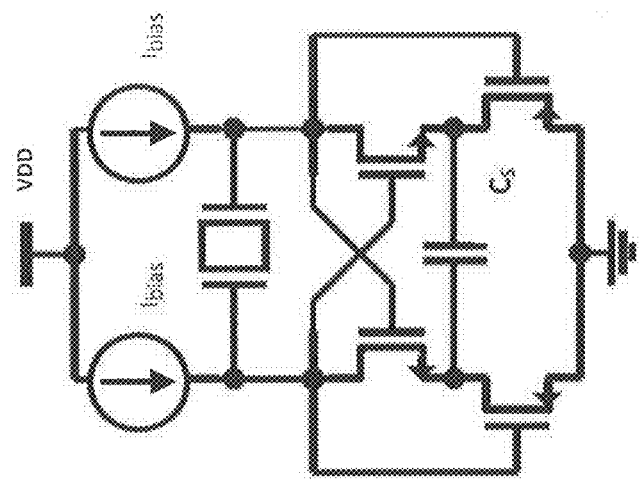
FIG. 3B shows an enhanced cross-coupled oscillator similar to the oscillator of FIG. 3A.
Figure 3A:
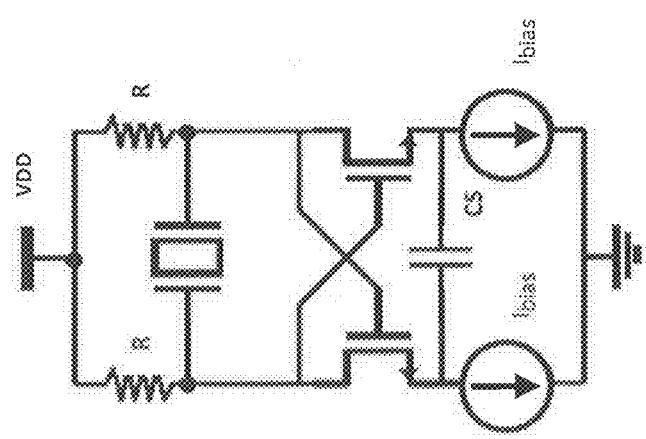
FIG. 3A shows a cross-coupled oscillator with an electro-mechanical resonator.

FIG. 3A shows a cross-coupled oscillator as described in *Resonance-Mode Selection and Crosstalk Elimination Using*

*Resonator-Synchronized Relaxation Oscillators*, J. R. Westra et al., *Proc. of European Solid-States Circuit Conference*, 1998. The oscillator comprises cross-coupled NMOS transistors and an electro-mechanical resonator. The sources of the NMOS transistors are connected by a capacitor $C_S$. The capacitor opens the loop formed by the transistors and resonator at DC and closes the loop as desired at high frequencies to provide the required gain for oscillations to start. Although the capacitor helps inhibit the oscillator from latching to DC, this configuration suffers from several drawbacks such as spurious relaxation oscillations and inferior phase noise performance. At low frequency, when the oscillator is starting operation, the resonator still has very high impedance. This can cause relaxation oscillations to occur in the oscillator. The relaxation oscillations predominantly depend on the value of the capacitor $C_S$, combined with impedances seen at the source of the cross-coupled pair. The relaxation oscillation could occur at the same time as the main oscillation so as to appear as sidebands in the output signal. Alternatively, the relaxation oscillation could overcome the main oscillation. Stability analysis can be performed to determine the largest capacitor possible to avoid relaxation oscillations, but at the expense of lower signal swing and worse phase noise performance. The gate bias voltage is also not deterministic and relies on the current sources and the resistors.

FIG. 3B shows a cross-coupled oscillator similar to the oscillator of FIG. 3A, the difference being that the current sources are replaced with a second pair of NMOS transistors, the gates of which are connected to the drains of the first pair of NMOS transistors to set the drain common-mode voltages by providing DC feedback. However, due to headroom limitations from the stacked transistors, this oscillator still suffers from a low voltage swing and degraded phase noise.

Figure 4B:
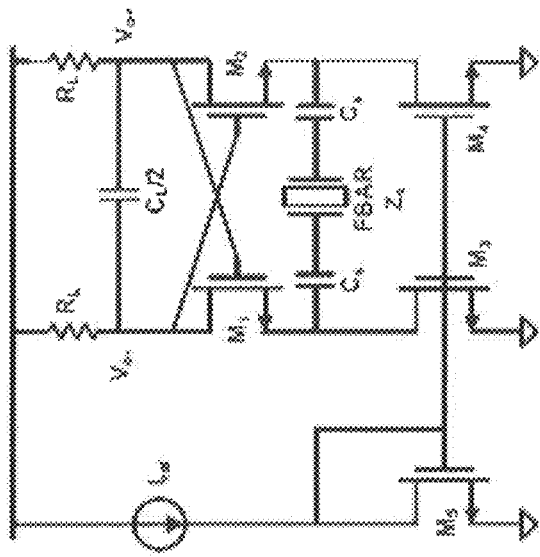
FIG. 4B shows a balanced oscillator with the electro-mechanical resonator and DC-blocking capacitors at the source.
Figure 4A:
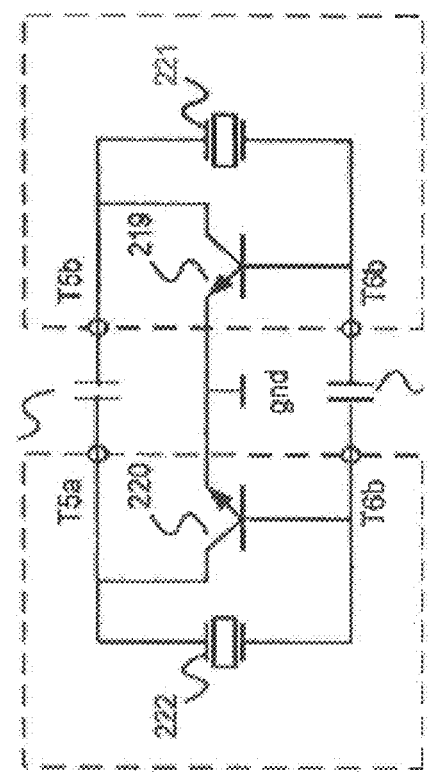
FIG. 4A shows a bipolar balanced oscillator having two electro-mechanical resonators and DC-blocking capacitors.

FIG. 4A shows a bipolar balanced oscillator having two resonators and blocking capacitors as described in U.S. Pat. No. 7,362,193 to Mattisson. Since two resonators are required, however, this increases the amount of area used in an IC package or on a printed circuit board, and increases the bill of materials. Also, mismatch of the resonators can affect circuit performance.

FIG. 4B shows a balanced oscillator as described in *A 50 ppm 600 MHz Frequency Reference Utilizing the Series Resonance of an FBAR*, Brian Otis, *IEEE Radio Frequency Integrated Circuits Symposium*, 2010. The resonator is located between, but isolated by capacitors from, the sources of the cross-coupled transistors to eliminate the DC gain. The cross-coupled loop closes at the resonance frequency formed by the thin-film bulk acoustic wave resonator (TFBAR or FBAR) in series with capacitors $C_S$. The oscillator suffers from phase noise degradation and may potentially oscillate at unwanted frequencies.

FIGS. 5A and 5B show Colpitts differential oscillators having a piezoelectric resonator as disclosed in U.S. Pat. No. 7,362,193 to Mattisson and *A Sub-100 uW 2 GHz Differential Colpitts CMOS/FBAR VCO*, Brian Otis, *IEEE Custom Integrated Circuits Conference*, 2011, respectively. Each oscillator has a pair of cross-coupled transistors that share a common-drain. The output of each oscillator is at the source of the transistors, while in a Pierce oscillator the output is at the drain of the cross-coupled pair. Although the Colpitts oscillators do not have the DC latch problem, the oscillators require a biasing circuit and a lower voltage gain that requires $g_m$-boosting to help start the oscillations. This lowers the voltage headroom and complicates the oscillator design.

Co-pending and commonly assigned U.S. patent application Ser. No. 13/909,739, which is herein incorporated by reference in its entirety, discloses an oscillator and method for generating balanced oscillations using an electro-mechanical resonator and cross-coupled complementary transistors (also referred to as inverters). Complementary means a combination of a P-type transistor and an N-type transistor such as, for example, a complementary metal oxide semiconductor inverter also referred to as a CMOS inverter. To avoid the oscillator latching to DC, the oscillator starts the oscillations in single-ended mode by disabling one of the inverters. Starting in single-ended mode allows the oscillator to accumulate energy to kick-start the oscillator into balanced mode. Specifically, once oscillations are established, the oscillator transitions to differential or balanced mode by enabling both inverters. The oscillator also has a switchable bank of resistors in parallel with both inverters. The switchable bank of resistors is enabled to maximize shunt resistance at start-up, and disabled to minimize shunt resistance when transitioning to differential mode, then maximized again when operating in differential mode at steady state.

In contrast to existing approaches, the present disclosure describes a cross-coupled complementary oscillator, comprising an electro-mechanical resonator that does not latch to a static DC state, that inhibits relaxation mode oscillations, and that commences oscillations directly in balanced mode. None of the existing approaches to resolving the DC latch problem can be applied to cross-coupled complementary structures (except co-pending and commonly assigned U.S. patent application Ser. No. 13/909,739 that starts in single-ended mode before transitioning to complementary mode).

Frequency synthesizers require tunable oscillators because of the frequency inaccuracies of the resonators, and resonator frequency drift due to changes in temperature. Oscillators comprising an electro-mechanical resonator such as a piezoelectric resonator can be tuned by adjusting the capacitance value in a resonator tank, either through voltage-controlled variable capacitors (varactors) or a switchable capacitor bank, assuming the output frequency is between the series resonance frequency ($f_S$) and the parallel resonance frequency ($f_P$) of the resonator. There are limits, however, to the maximum-to-minimum (or on-to-off) capacitance ratio due to the parasitic capacitance in the oscillator circuitry and the Q value required for a particular application. In deep sub-100 nm CMOS, for example, an on-to-off capacitance ratio of 6-to-1 in a switchable capacitor bank can be achieved with a satisfactory Q value. Generally, however, a tunable oscillator comprising a piezoelectric resonator requires a higher on-to-off capacitance ratio. Furthermore, tuning the oscillator frequency by a linear amount requires an exponential change in capacitance, as further explained below in relation to FIGS. 17A and 17B.

The present disclosure also describes an apparatus and method for reducing the required on-to-off capacitance ratio in a cross-coupled complementary balanced oscillator comprising an electro-mechanical resonator while maintaining a large tuning range.

Figure 6:
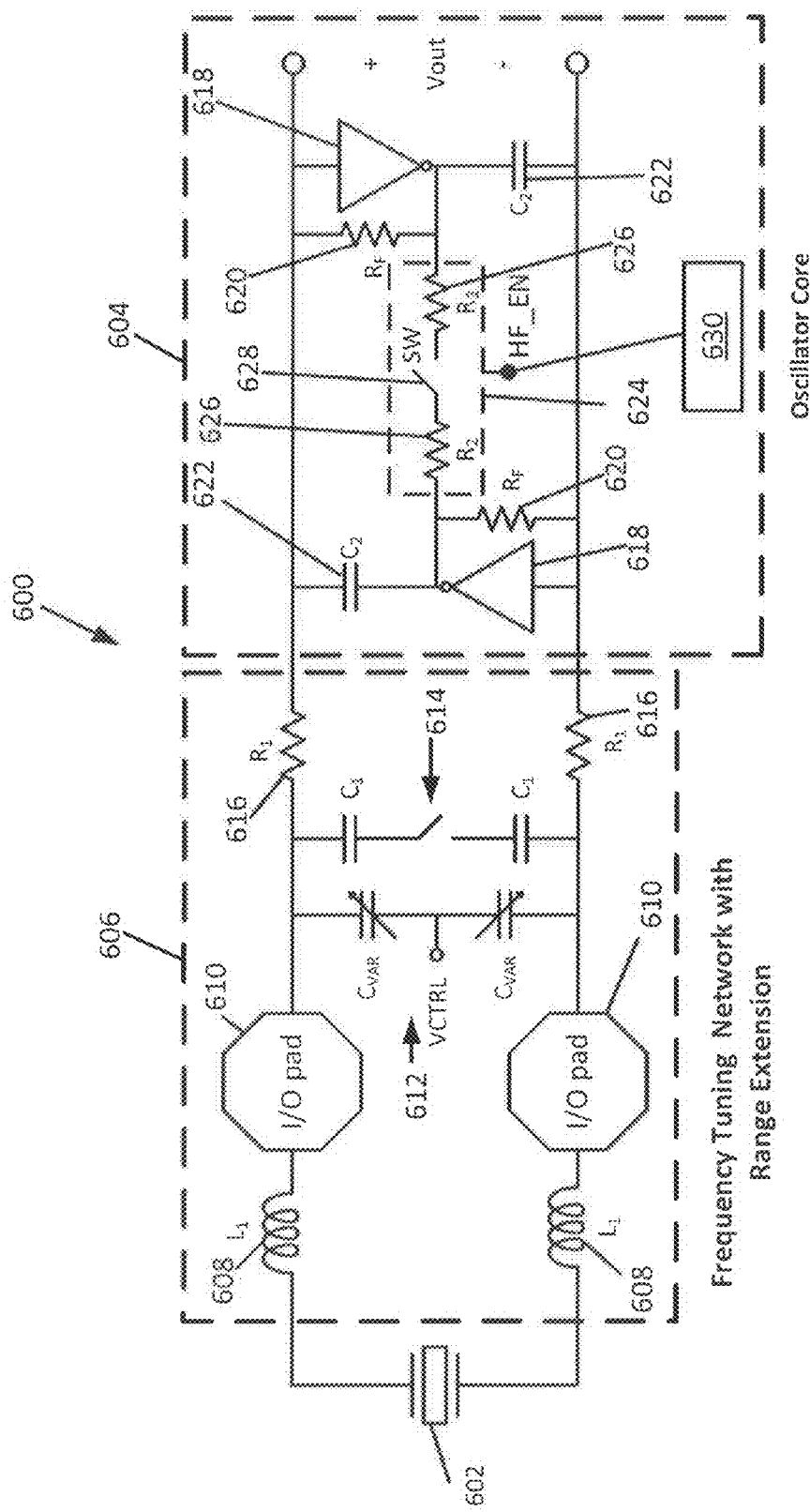
FIG. 6 shows a complementary cross-coupled voltage controlled oscillator in accordance with an embodiment of the present disclosure.

FIG. 6 shows a cross-coupled complementary voltage-controlled oscillator 600 (VCO) in accordance with an embodiment of the present disclosure. This oscillator 600 can be used in, for example, high performance phase-locked loops (PLLs) to generate a precise frequency reference that demands a very good phase noise performance. The oscillator 600 comprises an electro-mechanical resonator 602, an oscillator core 604, and a frequency tuning network 606 for extending the frequency tuning range of the oscillator 600. The resonator 602 is for creating oscillations in the oscillator 600. The resonator 602 can be, for example a Bulk Acoustic Wave resonator (BAW), a Surface Acoustic Wave resonator (SAW), a Micro-Electro-Mechanical System resonator (MEMS), or a quartz crystal (XTAL) resonator. The resonator 602 is connected in parallel with the frequency tuning network 606 and oscillator core 604. The resonator 602 is connected in series with inductors 608 and I/O pads 610 in the frequency tuning network 606. The resonator 602, inductors 608, variable capacitors (varactors or $C_{VAR}$s) 612, and switched capacitors 614 form a resonator tank. Resistors 616 connect the resonator tank to the oscillator core 604. Resistors 616 act as low-pass filters to mitigate the likelihood of any unwanted high-frequency oscillation due to the parasitics of the IC package, or overtone modes of the resonator 602. The inductors 608 are implemented on the IC package as they require high Q. Integrated inductors on silicon are generally too lossy for high-performance applications. The inductors 608 can be implemented by means of traces on a flip-chip (FC) package, or by bond wires in a more traditional wirebond IC package. Resistors 616 suppress the package resonance oscillation at an unwanted frequency created by 608, the on-die switched capacitors 614, the on-die varactors 612, and the parallel plate capacitance of resonator 602.

The oscillator core 604 is for starting and sustaining balanced oscillations in the oscillator 600. The oscillator core 604 comprises two cross-coupled complementary inverters 618, two self-biasing feedback resistors 620, two capacitors 622, a resistor network 624, and a controller 630. The cross-coupled complementary inverters 618 form a series circuit or loop. A self-biasing feedback resistor 620 is in parallel with each of the cross-coupled inverters 618. The inverters can comprise any type of transistors including, without limitation, MOS, bipolar junction transistors (BJT), and JFET. The self-biasing feedback resistors 620 are in parallel with the inverters 618 to set a bias point of the inverters for maximum transconductance ($g_m$) in order to maximize the small-signal loop gain in the oscillator 600. A capacitor 622 is connected in series in the loop to the output of each cross-coupled complementary inverter 618. In other words, the terminals of each capacitor 622 connect the output of one inverter 618 to the input of the other inverter 618. The inverter 618 and capacitor 622 structures are cross-coupled with one another. Effectively, the inverters 618 are capacitively cross-coupled with one another. The capacitors 622 inhibit the cross-coupled complementary inverters 618 from latching to a direct current when starting oscillations by breaking the positive feedback loop. The resistor network 624 comprises resistors 626 and a switchable connection 628 for connecting the outputs of the inverters 618 in series with the resistors 626. The resistor network 624 is also known as a switchable shunt resistor. The switchable connection 628 is enabled and disabled according to a signal from the controller 630 at input HF_EN. In the embodiment of FIG. 6, the resistor network 624 comprises a pair of resistors 626 with a switchable connection 628 therebetween. In an alternate embodiment, the resistor network 624 comprises a pair of switchable connections 628 between a pair of resistors 626. In a further embodiment, a resistor 626 can be placed in between two or more switchable connections 628. When oscillations are first started in the oscillator 600, the controller 630 enables the switchable connection 628. When the resistor network 624 is connected to the oscillator 600, a high-pass filter is created by the capacitors 622 and the resistors 626. The high pass filter inhibits parasitic and undesirable relaxation-mode oscillations from occurring in the oscillator 600. In another embodiment, the resistor network 624 has no switchable connection so that it is always connected to the outputs of the inverters 618. Accordingly, there is no start-up sequence. This embodiment would be used for low signal performance applications.

Figure 7:
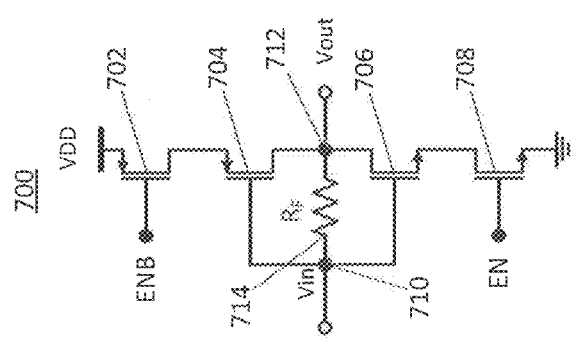
FIG. 7 shows an embodiment of the inverter of the oscillator shown in FIG. 6.

FIG. 7 shows an inverter 700, which is similar to inverters 618, including feedback resistor 620, shown in FIG. 6. The inverter 700 comprises two PMOS transistors 702, 704 and two NMOS transistors 706, 708, all connected in series. Voltage supply VDD is connected to the source of PMOS transistor 702. The gate of PMOS transistor 702 is connected to and controlled by input ENB, and the gate of NMOS transistor 708 is connected to and controlled by input EN. Inputs EN and ENB receive complementary signals and simultaneously enable or disable the transistor switches 702 and 708. One of the PMOS transistors 704 and one of the NMOS transistors 706 are connected at their gates and drains. The gates are connected to an input 710, and the drains are connected to an output 712. Feedback resistor 714 (same as feedback resistor 620 in FIG. 6) connects input 710 and output 712.

Figure 8:
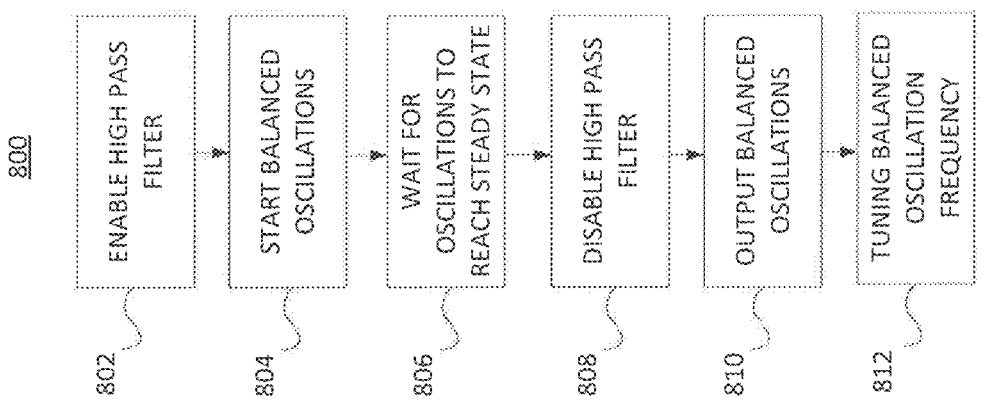
FIG. 8 shows a flowchart of a process for operating the oscillator of FIG. 6.

Referring back to FIG. 6, the capacitors 622 are located at the outputs of the inverters 618 (drains of PMOS transistor 704 and NMOS transistor 706 of FIG. 8). This arrangement of the capacitors 622 breaks the positive feedback loop of the cross-coupled complementary inverters 618 at DC, while shorting the loop at high frequencies. Although capacitors 622 serve a similar purpose as the capacitors in the prior art, the locations of the capacitors 622 are different. By breaking the loop at the outputs (drains) of the inverters 618 with the novel locations of the capacitors 622, a complementary cross-coupled structure can be used together with an electro-mechanical resonator to produce a balanced output without latching to DC. Also, because there is no loop gain at DC, the oscillator 600 can immediately start building an oscillatory differential output signal when it first commences operation, and does not need to start in single-ended mode.

The undesired relaxation-mode oscillation created by the DC blocking capacitors can be eliminated by means of a high-pass filter. When enabled, the switchable resistor network 624, in combination with the capacitors 622, together create a high-pass filter to eliminate low-frequency relaxation-mode oscillations. Prior art approaches that use source degenerative capacitance also suffer from the relaxation oscillation problem. For the prior art, stability analysis needs to be conducted to determine a capacitance value that both inhibits DC latching and also avoids creating relaxation oscillations. On one hand, too small of a capacitance value causes phase noise degradation due to lower loop gain and hence lower swing. On the other hand, too large of a capacitance value will create relaxation oscillations. In an embodiment of the present disclosure, a high-pass filter and a startup procedure for enabling and disabling the high-pass filter are provided to allow the oscillator 600 to maintain phase noise performance while eliminating the size constraint on capacitors 622 due to the stability limits. In other words, the capacitors 622 can be sized relatively large so that there is no phase noise degradation, and resistors 626 can be sized accordingly to filter out the relaxation gain to prevent the relaxation oscillation from building up at the start-up phase. When the oscillator 600 reaches steady state oscillations, high pass filtering is no longer required because relaxation oscillation will not start in this state. Accordingly, the switchable resistor network 624 is disabled by opening the switch 628, and the branch becomes an open circuit to help achieve high swing and high phase noise performance. Alternatively, to reduce the controller complexity the switchable resistor network 624 can remain enabled, or simplified to a fixed resistor without a switch, for less demanding applications.

FIG. 8 shows a flowchart of a method 800 for operating the oscillator of FIG. 6 The method comprises enabling a high pass filter 802 in the oscillator, starting balanced oscillations in the oscillator 804, waiting for balanced oscillations to reach a steady state 806, disabling the high pass filter 808, outputting the balanced oscillations as a signal 810, and tuning the frequency of the balanced oscillations 812. In another embodiment, the high pass filter is always enabled so that the step of disabling the high pass filter 808 is not performed. Although this embodiment suffers from phase noise degradation, it may be used in low performance applications.

Before starting the balanced oscillations 804, the controller 630 enables or activates the high-pass filter 802 by sending a signal to input HF_EN to enable the resistor network 624. Effectively, a signal at input HF_EN activates or closes the switch 628 and connects the resistors 626 in the oscillator core 604 to form the high-pass filter with the capacitors 622 and the input impedance of the inverting gain stage. To start oscillations 804 in the oscillator 600, a power supply voltage is applied to the oscillator core 604 to energize the circuitry of the oscillator 600. This causes the electro-mechanical resonator 602 to commence resonating at a frequency to produce balanced oscillations in the oscillator 600. The capacitors 622, which are at the output of the inverters 618, inhibit the inverters 618 from latching to DC state. The high-pass filter is for eliminating relaxation mode oscillations, potentially caused by the capacitors 622 and feedback resistors 620, without affecting high frequency gain at the desired oscillation frequency. The resistors 626 typically have small resistance values that help the high-pass filter provide attenuation at low frequencies.

When the resistors 626 are connected, the oscillator 600 is considered to be in "low-swing" mode. In low-swing mode, the oscillator 600 can accumulate balanced oscillations to reach the desired oscillation frequency. The oscillator 600 then waits 806 a period of time to allow balanced oscillations to stabilize at the desired frequency so as to reach a sustainable or steady-state large-signal operation. Sustainable or steady-state balanced oscillations are reached when there is unity gain, or a gain of 0 decibels, at the desired oscillation frequency and the gain at any other frequency, such as relaxation frequency, is less than 0 decibels.

Once oscillations in the oscillator 600 reach a sustainable or steady-state large-signal at the desired frequency, the high pass filter is disabled 808 by the controller 630 by sending a signal to input HF_EN. This opens or deactivates the switch 628 which disconnects the resistors 626 from the oscillator 600 to create an open circuit. Disabling the high pass filter reduces phase noise and increases the amplitude of the balanced oscillations in the oscillator. The balanced oscillations are output 810 by the oscillator as a differential signal. A differential signal comprises a pair of signals with common-mode noise rejection property, but a phase difference of 180 degrees.

The frequency of the balanced oscillations in the oscillator 600 can be tuned 812 by varying the capacitance in the oscillator 600. Varactors 612 can be controlled by a control voltage at input VCTRL to change the capacitance in the tuning network 606 of oscillator 600. Also, the switch for connecting the switched capacitors 614 to the oscillator 600 can be closed to change the capacitance in the oscillator 600.

Figure 9A:
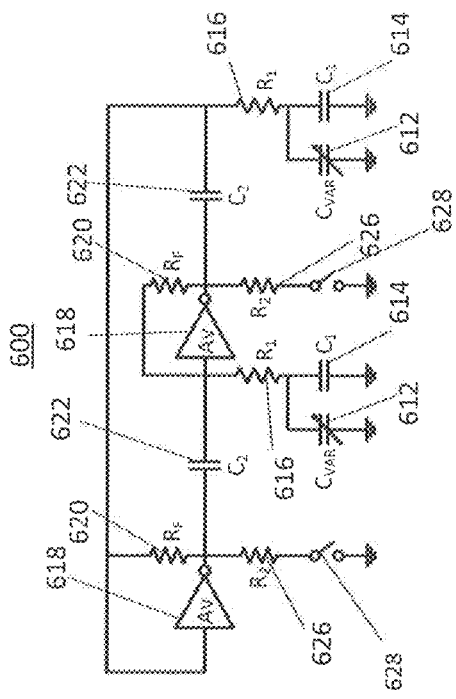
FIGS. 9A and 9B show simplified circuit diagrams of the oscillator of FIG. 6 at low frequencies, with a switchable resistor when disabled and enabled, respectively.

FIG. 9A shows a simplified circuit diagram of the oscillator 600 of FIG. 6 at low frequencies (where the resonator is approximated as an open-circuit) and when input HF_EN is disabled and the resistors 626 are not connected to the oscillator 600. The circuit of FIG. 9A is not a desired configuration when first commencing oscillations in the oscillator 600 and is shown only for the purposes of explanation. At low frequency, the resonator 602 and inductors 608 have no effect on the oscillator 600 because the resonator 602 provides a very high impedance relative to the rest of the oscillator 600, and inductors 608 are nearly short circuits. In the state illustrated in FIG. 9A, the oscillator 600 is, effectively, a relaxation oscillator. In this state, the frequency of undesired relaxation oscillations in the oscillator 600 is determined by capacitors 622 and the input impedance of the gain stage, which is affected by feedback resistors 620, switched capacitors 614, and varactors 612.

Figure 9B:
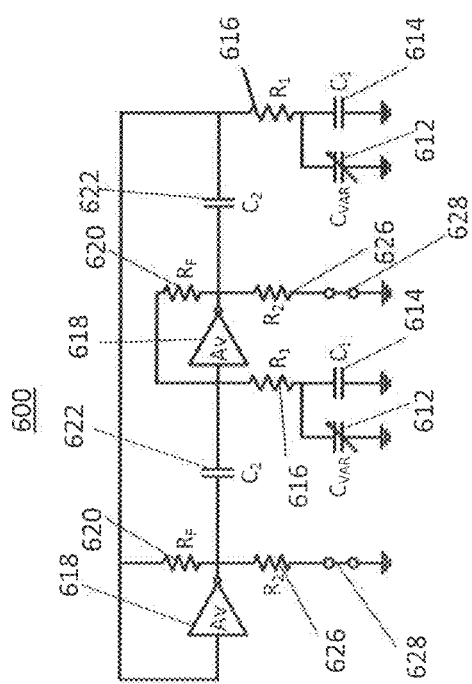

FIG. 9B shows a simplified diagram of the oscillator 600 of FIG. 6 at low frequencies where the resonator is approximated as an open-circuit, when HF_EN is enabled and the resistors 626 are connected to the oscillator 600. This is a desired configuration when first commencing oscillations in the oscillator 600. The resistors 626 add an extra pair of pole and zero to form a high order high-pass filter with varactors 612, switched capacitors 614, and capacitors 622, and feedback resistor 620. The high-pass filter creates additional low frequency attenuation to suppress the gain at the relaxation frequency without affecting high frequency gain at the desired oscillation frequency. This inhibits relaxation oscillations from occurring in the oscillator 600. The resistors 626 need to be sufficiently small to suppress relaxation oscillation, but sufficiently large not to attenuate the main oscillations. If the high-pass filter is not turned on during start-up, unwanted relaxation oscillation can occur first. These parasitic oscillations can continue to exist at steady state operation. Depending on the gain at the desired oscillation frequency, the desired oscillation frequency may overcome the relaxation oscillation frequency, or the relaxation oscillation frequency may dominate to prevent the oscillations from reaching the desired frequency.

Figure 10:
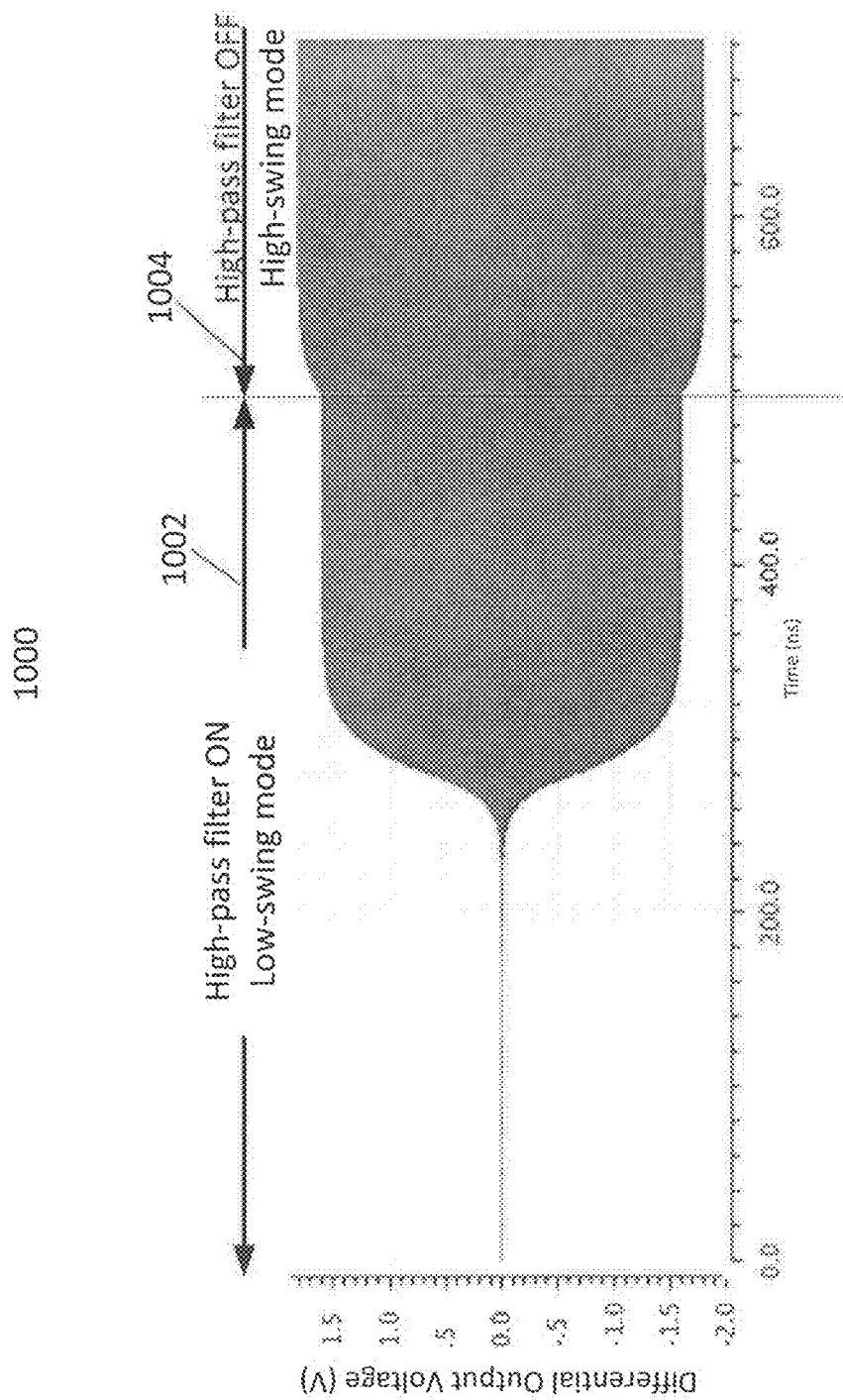
FIG. 10 shows a plot of oscillations created by the oscillator of FIG. 6.

FIG. 10 shows a plot 1000 of oscillations created by the oscillator 600 of FIG. 6. The y-axis shows the differential output voltage and the x-axis shows the time in nanoseconds. To inhibit relaxation oscillations from occurring, the oscillator 600 follows a start-up sequence. The high-pass filter is enabled when the gain stage is enabled. This causes the oscillator to enter "low-swing" mode 1002 so balanced oscillation will begin to accumulate in the oscillator. Once the oscillation stabilizes, the high-pass filter is disabled and the oscillator 600 enters "high-swing" mode 1004 for maximum phase noise performance. For low-end applications, the oscillator 600 may continue to operate in low-swing mode 1002 at steady state to reduce the start-up complexity and time, and remove the need for the switch 628. This assumes that the phase noise performance in the low-swing mode is sufficient for the target application.

FIGS. 11A-C show the open loop gain in decibels (dB) versus frequency (GHz) for various configurations of the oscillator 600 of FIG. 6 over time, including when commencing oscillations and a high-pass filter is disabled, when the high-pass filter is enabled, and when oscillations have reached the desired frequency and the high-pass filter is disabled.

FIG. 11A shows a graph of the open loop gain versus frequency when commencing oscillation in the oscillator 600 as shown in FIG. 6 wherein the high-pass filter is disabled. Disabling the high-pass filter when commencing oscillations is an undesired configuration, and the resulting graph in FIG. 11A is for the purposes of explanation, only. Since the gain at the relaxation frequency 1102A ($G_R$) is higher than 0 dB or unity gain, it is possible for the relaxation oscillation to start at this frequency, rather than at the intended frequency 1104A ($G_F$).

FIG. 11B shows the open loop gain as compared to oscillation frequency when commencing oscillations in the oscillator 600 of FIG. 6 wherein the high-pass filter is enabled. Enabling the high-pass filter when commencing oscillations is a desired configuration. Enabling the high-pass filter during start-up significantly reduces the gain at relaxation frequency 1102B to less than 0 dB or unity gain, which inhibits relaxation oscillations from occurring in the oscillator 600. Since the gain at the desired oscillation frequency 1104B ($G_F$) is the only point that is higher than 0 dB or unity gain, the oscillation will build up to the desired frequency. Once the steady-state oscillation has been achieved at the desired frequency, the high-pass filter is turned off by the controller to transition the oscillator to high-swing mode with lower phase noise.

FIG. 11C shows the open loop gain as compared to oscillation frequency when oscillations have reached the desired frequency and wherein the high-pass filter is disabled. When oscillations reach large-signal steady-state at the desired frequency 1104C, the momentum of the oscillations (triggered in the high-Q electro-mechanical resonator) cause the oscillator to continue to run at the desired frequency 1104C. At large-signal steady state, the gain at frequency 1104C is settled to 0 dB or unity gain to sustain the oscillation. If the gain at frequency 1102C is less than 0 dB or unity gain, then it is not possible for relaxation oscillations to occur.

Figure 12:
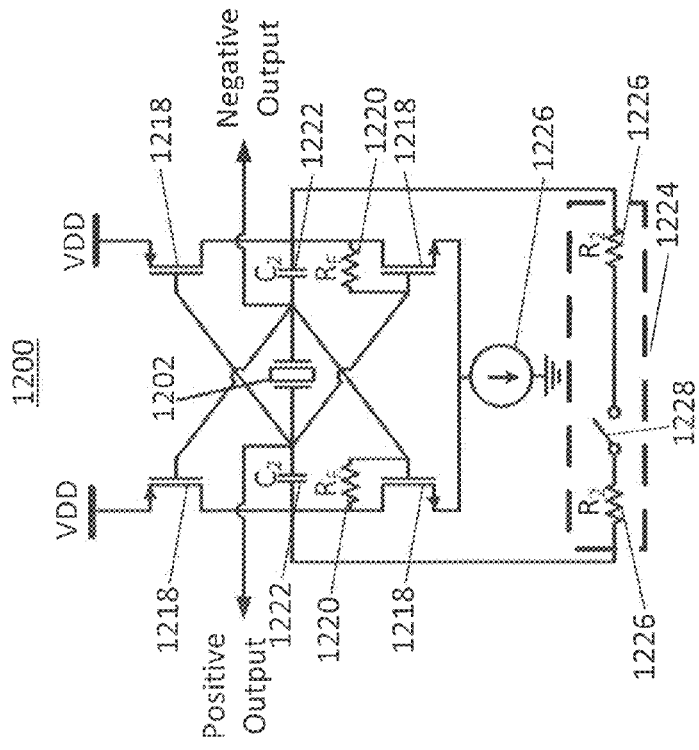
FIG. 12 shows an oscillator, similar to the oscillator of FIG. 6, in accordance with another embodiment of the present disclosure.

FIG. 12 shows an oscillator 1200, similar to the oscillator 600 of FIG. 6, in accordance with another embodiment of the present disclosure. The oscillator 1200 comprises an NMOS-based tail current source 1226 connected to the source of the NMOS transistors 1218. The tail current source 1226 helps to control or vary the amplitude of, and reduce phase noise in, the balanced oscillations in the oscillator 1200. Instead of, or in addition to, a tail current source 1226, one or more of a resistor, a variable resistor and an array of switchable (programmable) resistors can be used to control the amplitude and reduce phase noise in the balanced oscillations. A frequency tuning network, similar to the frequency tuning network 606 shown in FIG. 6 may be combined with the oscillator 1200 to permit tuning the frequency of the oscillations therein.

Figure 13:
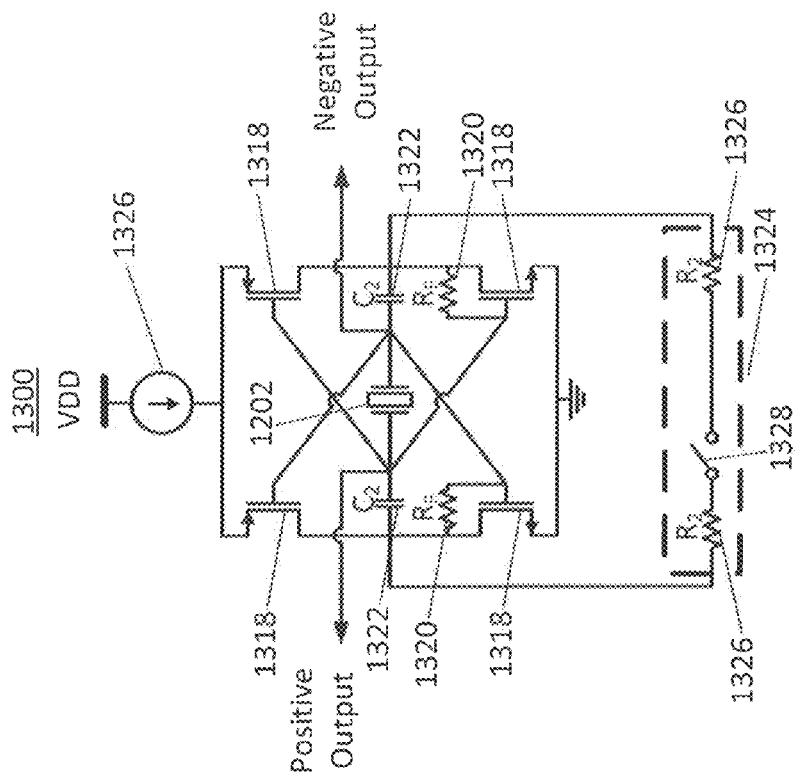
FIG. 13 shows an oscillator, similar to the oscillator of FIG. 6, in accordance with another embodiment of the present disclosure.

FIG. 13 shows an oscillator 1300, similar to the oscillator 600 of FIG. 6, in accordance with another embodiment of the present disclosure. The oscillator 1300 comprises a PMOS-based current source 1326 connected to the source of the PMOS transistors 1318. The current source 1326 is for varying the amplitude of, and reducing phase noise in, the balanced oscillations at a flicker noise region. Instead of, or in addition to, a tail current source 1326, one or more of a resistor, a variable resistor and an array of switchable (programmable) resistors can be connected to the source of the PMOS transistor for varying the amplitude of, and reducing phase noise in, the balanced oscillations. A frequency tuning network, similar to 606 shown in FIG. 6 may be combined with the oscillator 1300 to permit tuning the frequency of the oscillations in the oscillator 1300.

An electro-mechanical resonator can be modeled by a lumped RLC circuit. Both 2-port and 1-port models of the lumped RLC circuit can be used to describe the electrical behavior of the resonator. The 1-port model, which is more relevant to oscillator design, is known as Butterworth-Van-Dyke (BVD), or modified BVD (mBVD).

Figure 14:
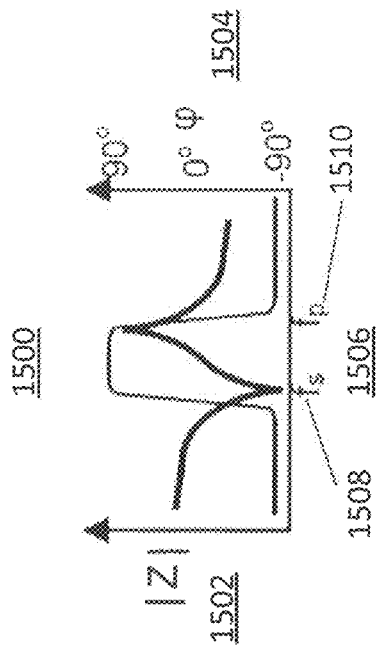
FIG. 14 shows a mBVD model of an electro-mechanical resonator.
Figure 15:
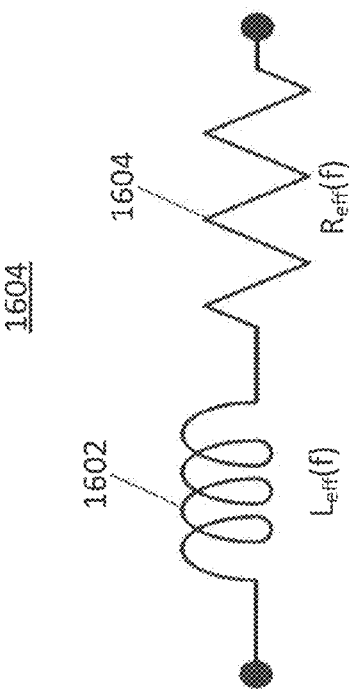
FIG. 15 shows a plot of the impedance magnitude and impedance phase of the modified Butterworth-Van-Dyke (mBVD) model of an electro-mechanical resonator over a range of frequencies.

FIG. 14 shows an mBVD model 1400 of an electro-mechanical resonator. FIG. 15 shows a plot 1500 of the impedance magnitude 1502, on a logarithmic scale, and impedance phase 1504, on a linear scale, of the electro-mechanical resonator of FIG. 14 at various frequencies 1506. Below a series resonance frequency 1508 ($f_s$) and above a parallel resonance or anti-resonance frequency 1510 ($f_p$), the resonator exhibits a capacitive behavior, or acts like a capacitor. At DC, the resonator is essentially an open-circuit. Between frequencies $f_s$ and $f_p$ the resonator exhibits an inductive behavior, or acts like an inductor. At resonance frequency $f_s$, the series $L_m$-$C_m$ motional branch acts nearly as a short and the resonator exhibits its lowest impedance, which has a purely real part ($R_m$) with no imaginary part. By comparison, when frequency f approaches infinity, the resonator impedance approaches zero, but the impedance has both real and imaginary parts. At $f_p$, the motional branch and the parallel branch co-resonate and the resonator exhibits its highest impedance, which is also purely real. Resistances 1402, 1404, and 1406 model the resonator 1400 losses when operating in the multi-gigahertz frequencies.

The frequency response shown in FIG. 15 shows a significant change in impedance levels over a narrow frequency band between frequencies $f_s$ (1508) and $f_p$ (1510), from the absolute minimum to maximum. For example, a typical value of the minimum impedance at frequency $f_s$ is approximately 1 to 2 ohms and a typical maximum impedance at frequency $f_p$ is approximately 2 kilohms to 6 kilohms for a FBAR/BAW resonator.

Because the resonator 1400 is only inductive between frequencies $f_s$ and $f_p$, the bandwidth or distance between frequencies $f_s$ and $f_p$ determines the frequency tuning range of the oscillator 1400. The frequency tuning range (FTR) of a resonator is defined by the formula $(f_p-f_s)/f_s$. Effective coupling $k_{eff}^2$ is defined by the formula $k_{eff}^2=(f_p^2-f_s^2)/f_s^2$. Based on this formula, it is apparent that the larger the FTR, the higher the $k_{eff}^2$. For example, FBAR/BAW type resonators have a $k_{eff}^2$ equal to around 6%, which is why these piezoelectric resonators are most suitable for narrowband applications. In between $f_s$ and $f_p$ frequencies, the mBVD model of the resonator 1400 can be simplified to an effective inductance, as well as an effective series resistance, that determines the resonance quality factor Q.

Figure 16:
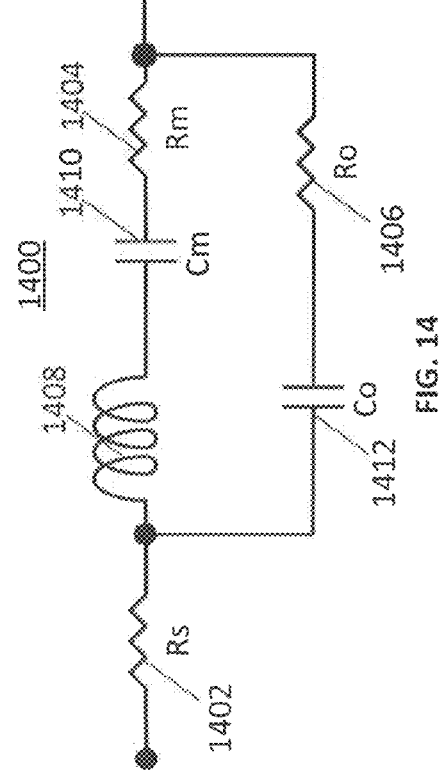
FIG. 16 shows a simplified circuit diagram of the mBVD model of FIG. 14.

FIG. 16 shows a simplified circuit diagram 1600 of the mBVD model 1400 of FIG. 14 valid between $f_s$ and $f_p$. The effective inductance $L_{eff}(f)$ 1602 is in series with the effective resistance $R_{eff}(f)$ 1604 where f is the frequency variable. Above $f_s$, the inductance from inductor $L_m$ 1408 dominates in the series branch and the resonator 1400 exhibits an inductive behavior, or acts like an inductor. At frequency $f_p$, the series branch impedance resonates with the parallel capacitor $C_o$ 1412 branch, hence the resonator 1400 reaches its highest impedance. The working band of the resonator 1400 in parallel with the oscillator is therefore between fs and fp.

Figure 17A:
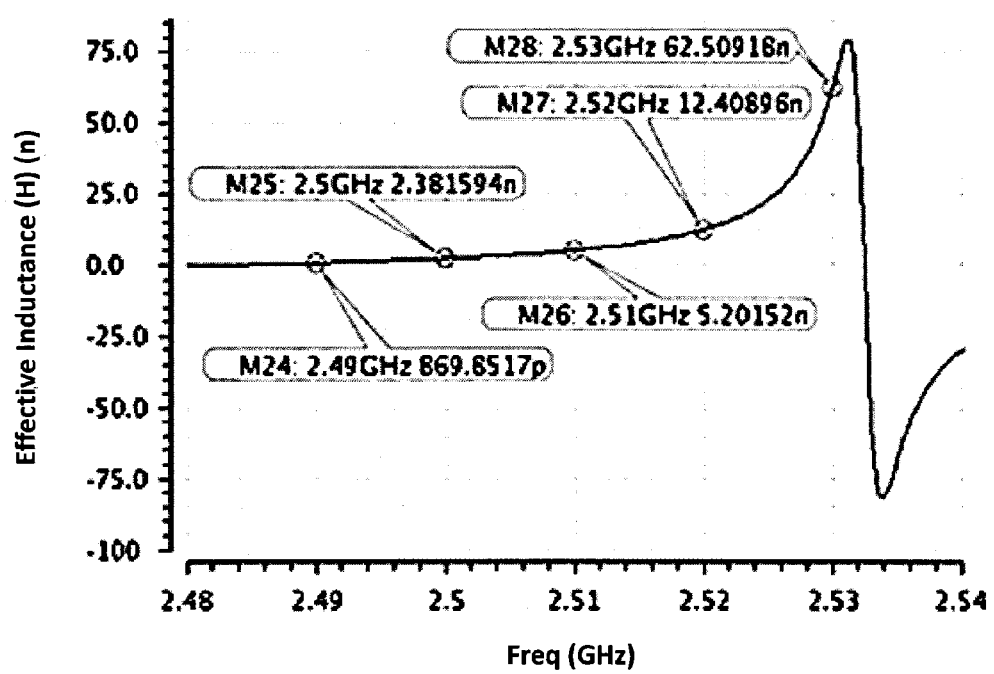
FIGS. 17A and 17B show example plots of the effective inductance of a resonator similar to the resonator shown in FIG. 14 in an oscillator similar to the oscillator of FIG. 6.
Figure 17B:
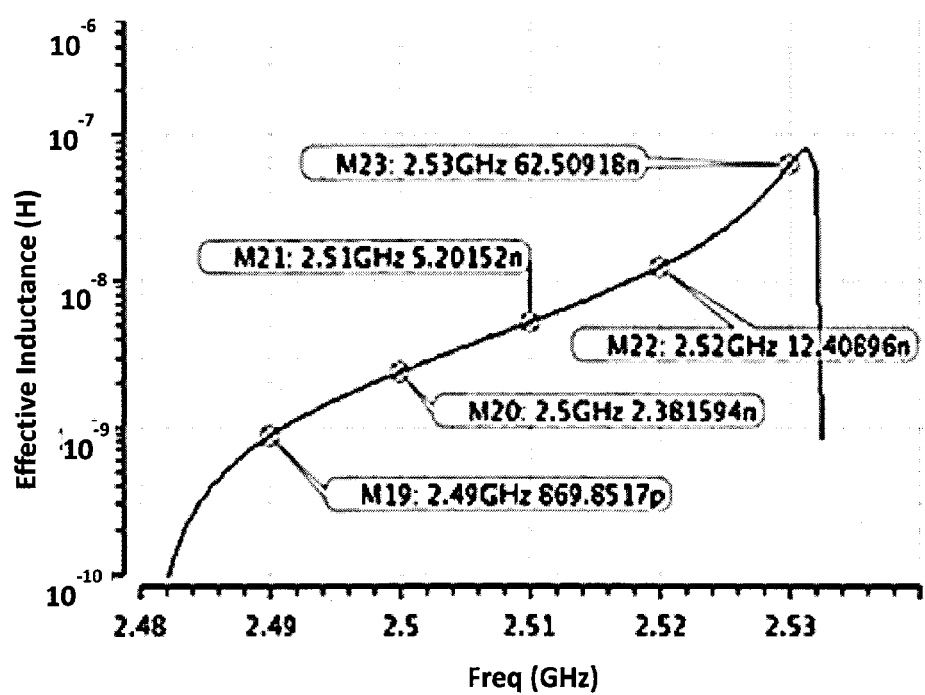

FIGS. 17A and 17B show example plots of the effective inductance of the mBVD model 1400 of a resonator shown in FIG. 14, in an oscillator similar to the oscillator 600 of FIG. 6, but without inductors L1 608, across a range of frequencies on a normal 1700A and logarithmic scale 1700B, respectively. As shown, the effective inductance changes significantly across the working range of frequencies. The oscillation frequency $f_0$ is determined by the amount of capacitance resonating with an effective inductance $L_{eff}$ of the resonator, and can be described by the equation $$f_0 = \frac{1}{2\pi\sqrt{L_{eff}C_{total}}}.$$

The effective inductance of the resonator increases exponentially with frequency. Between the frequencies $f_s$ and $f_p$, the effective inductance $L_{eff}$ can be approximated by the equation $\log(L_{eff}) \approx kf+n_0$, where k and $n_0$ are constants. The capacitance required for oscillation at a particular frequency is then derived according to the equation $$C \propto \frac{1}{f^2 10^{kf}}.$$

In other words, to linearly change the frequency of the oscillations in the oscillator, an exponential change in capacitance in the oscillator's resonant tank is required.

Greater changes in capacitance, however, require a larger capacitor to facilitate a large relative change in capacitance ($C_{MAX}/C_{MIN}$ ratio), which would in turn lead to a larger semiconductor die area and, potentially, a larger IC package size. Accordingly, it is desirable to keep the maximum amount of capacitance required to a minimum. This can be difficult to do, however, because of parasitic capacitance, which is always present in the oscillator, and imperfect switches for controlling the capacitor bank. Large capacitors require large (low-resistance) electronic switches to connect the capacitance to the circuit, and this relationship is fixed in order to maintain a good Q factor. This, however, makes it difficult to get a large relative change in capacitance ($C_{MAX}/C_{MIN}$ ratio) to tune the frequency of the oscillator since the larger the switch, the greater the parasitic capacitance, and this would increase $C_{MIN}$ in the denominator. As such, the large parasitic capacitance restricts the $C_{MAX}/C_{MIN}$ ratio of the switchable capacitor, thereby limiting the frequency tuning range.

FIG. 18 shows a capacitor bank 1800 comprising varactors 1802 and switched capacitors 1804 similar to the varactors 612 and switched capacitors 614 of oscillator 600 of FIG. 6, respectively. The varactors 1802 and switched capacitors 1804 are arranged in parallel with one another. The switched capacitors 1804 are enabled or connected by switches 1806. The switched capacitors 1804 may be metal-oxide-metal (MoM) or metal-insulator-metal (MiM) capacitors or any other types of fixed capacitors.

FIG. 19 shows a representation of an individual branch 1900 of the switchable capacitor 1804 of FIG. 18. Capacitors $C_{Bi1}$ 1902 is the top plate parasitics of the switchable capacitor 1804, and capacitors $C_{Bi2}$ 1904 is the bottom plate parasitic capacitance including other parasitic capacitances from the switch 1806. When the switch 1906 is closed, the branch capacitance is close to $C_{Mi}/2$, where $C_{Mi}$ 1908 is the main switchable capacitance element. But when the switch 1806 is open, instead of having an open circuit, the branch has an off capacitance of $$\left( \frac{C_{Mi} C_{Bi2}}{C_{Mi} + C_{Bi2}} + C_{Bi1} \right) / 2.$$

The parasitic capacitances $C_{Bi1}$ 1902 and $C_{Bi2}$ 1904 are proportional to $C_{Mi}$ 1908 and set a maximum bound on the max-to-min capacitance ratio of the capacitor bank 1800.

As an example, in a typical 65 nm CMOS technology, a max-to-min capacitance ratio of 6-to-1, with an acceptable Q in high-performance oscillator applications, can be achieved with switchable MoM capacitors. Although this ratio is usually acceptable in LC oscillator applications, it is in most practical cases too low for tuning electro-mechanical resonators as it would limit the amount by which the frequency of the oscillations could be tuned. A large tuning range is desired to compensate for resonator's trim accuracy, aging-induced frequency drift, and temperature-induced frequency drift.

Referring again to FIG. 6, the frequency tuning network 606 comprises two inductors $L_1$ 608, each inductor 608 connected in series with the resonator 602, and varactors 612 and switchable capacitors 614 connected in parallel. The inductors 608 help extend the tuning range of the oscillator 600. The effective inductance of the resonator 602 in series with inductors 608 is described by the equation $L_{eff\_new}=2L_1+L_{eff}$, where $L_{eff\_new}$ is the new effective inductance.

The fixed inductance $2L_1$ reduces the logarithmic slope of the effective inductance plot shown in FIG. 17B by increasing the inductance at low frequency oscillations. This makes the resonator tank less dependent on the inverse exponential change in capacitance to achieve a linear change in frequency. The overall capacitance C required for resonant oscillation at f with the resonator plus $2L_1$ can be described by the equation $$\propto \frac{1}{f^2 (2L_1 + 10^{kf+n_0})},$$

where f is frequency, and k and $n_0$ are constants.

The required capacitance ratio between the oscillator 600 with inductors $L_1$ 608 and the oscillator without the inductors can be described by the equation $$\frac{C_{withL1}}{C_{withoutL1}} = \frac{10^{kf+n_0}}{2L_1 + 10^{kf+n_0}}.$$

At high oscillation frequencies, where the capacitance of the oscillator 600 is set at a minimum, the amount of capacitance $C_{MIN}$ needed is roughly the same with or without the inductors $L_1$ 608, and the above ratio is close to 1. At a low oscillation frequency, however, where the capacitance of the oscillator 600 is set at a maximum, the amount of capacitance $C_{MAX}$ needed to achieve a particular frequency is reduced by virtue of adding the inductors $L_1$ 608 as compared to the oscillator without the inductors. Accordingly, this reduces the max-to-min capacitance ratio ($C_{MAX}/C_{MIN}$) needed to cover the same oscillation frequency tuning range. In other words, the inductors help achieve a desired tuning range for the oscillator 600, but with a smaller on-to-off capacitance ratio.

Referring again to the example discussed in relation to FIG. 17B, a capacitance of 4697 fF is required for the oscillator 600 to create oscillations at a frequency of 2.49 GHz, and a capacitance of 773 fF is required to create oscillations at a frequency of 2.51 GHz. If the oscillator core 604 has a fixed parasitic capacitance of 200 fF, the capacitor bank 612, 614 would require a maximum capacitance of 4497 fF and a minimum capacitance of 573 fF. The max-to-min capacitance ratio would, accordingly, be 7.8, which is difficult to consistently obtain in a standard CMOS 65 nm technology due to process variations and unavoidable parasitic capacitances.

Figure 20:
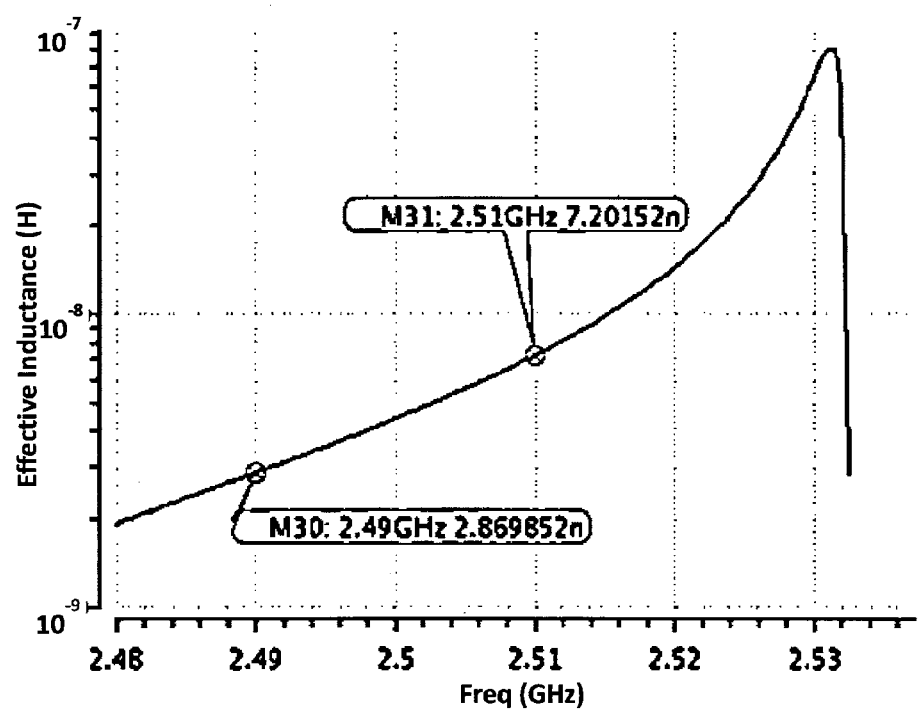
FIG. 20 shows a plot of effective inductance versus frequency of an electro-mechanical resonator in an oscillator.

FIG. 20 shows a logarithmic plot of effective inductance of the resonator plus two times inductor value $L_1$ versus frequency of a resonator in an oscillator similar to the resonator and oscillator used to obtain the plot in FIG. 17B, the difference being the oscillator comprises inductors $L_1$ each having an inductance value of 1 nH. The capacitance required to oscillate at 2.49 GHz is 1424 fF and at 2.51 GHz is 558 fF. If the fixed parasitic capacitance is 200 fF, the capacitor bank would need a maximum capacitance of 1224 fF and a minimum capacitance of 358 fF, hence a max-to-min ratio of only 3.4. Not only is this capacitance ratio more easily implemented in the 65 nm CMOS technology, but the total amount of capacitance needed has also dropped from 4497 fF to 1424 fF, which can significantly reduce die area and cost to implement the capacitor.

Figure 21A:
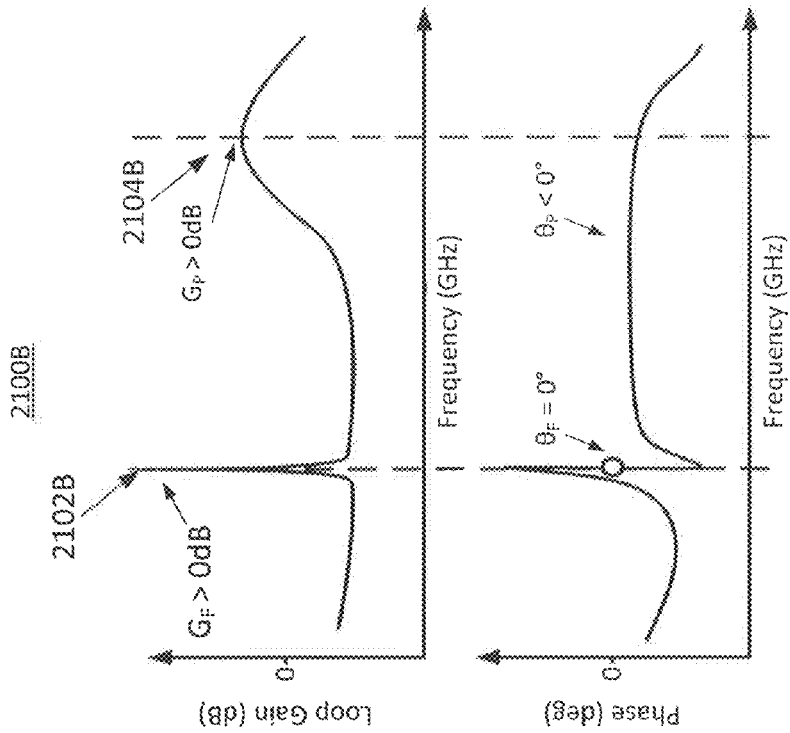
FIGS. 21A and 21B show plots of loop gain and phase for a range of frequencies for an oscillator similar to the oscillator of FIG. 6.

FIG. 21A shows a plot 2100A of the loop gain in decibels and phase in degrees for a range of frequencies, for an oscillator similar to the oscillator at start-up of FIG. 6 without resistors R1 616. At very high frequencies, the inductors $L_1$ 608 may introduce a secondary series resonance in the oscillator 600. This is because at frequencies above $f_p$, the resonator 602 exhibits a capacitive behavior, with the capacitance value close to $C_O$ 1412 of the mBVD model 1400 of FIG. 14. This forms a series resonance 2104A with the inductors $L_1$ 608. If the oscillator gain $G_P$ at the frequency corresponding to parasitic resonance 2104A is higher than 0 dB or unity gain when the phase $θ_P$ is equal to 0 degrees, the loop may begin oscillating in this parasitic mode. Resistors $R_1$ 616 increase the phase delay at high frequencies to prevent $θ_P$ from crossing the 0° point, where $G_P$ can be higher than 0 dB. Because Barkhausen criterion for oscillation to start requires that both $θ=0°$ and $G>0$ dB, the low-pass filtering action in the phase domain from $R_1$ 616 help prevent any oscillation from occurring at this secondary frequency.

Figure 21B:
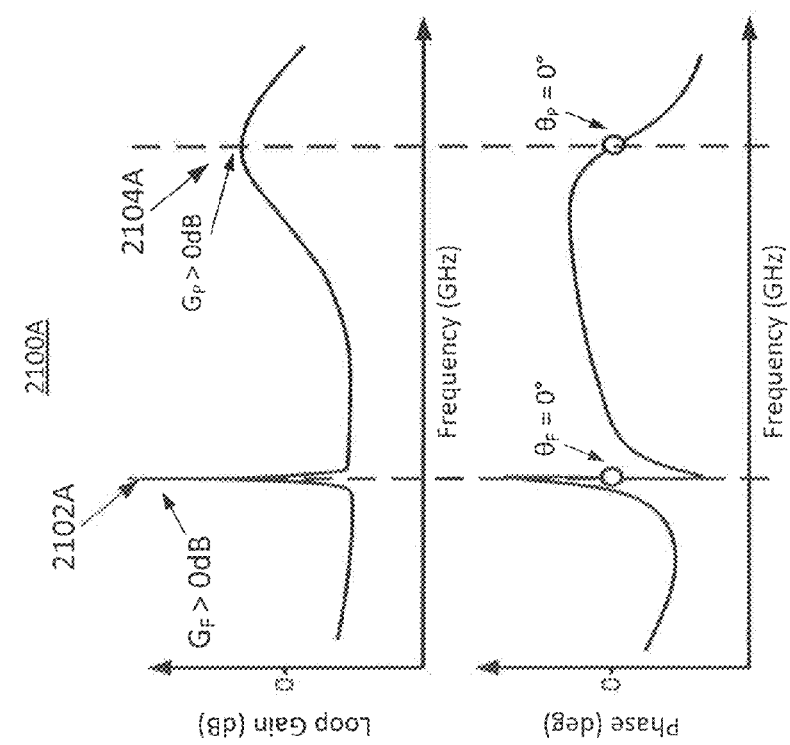

FIG. 21B shows a plot of the loop gain in decibels and phase in degrees for a range of frequencies, for an oscillator similar to the oscillator of FIG. 6 at start-up but with resistors R1 616. The gain and phase of the loop, $G_F$ and $θ_F$, for the main oscillation are unaffected, while $θ_P$ is always kept less than 0° beyond the main oscillation frequency 2102B.

Figure 22:
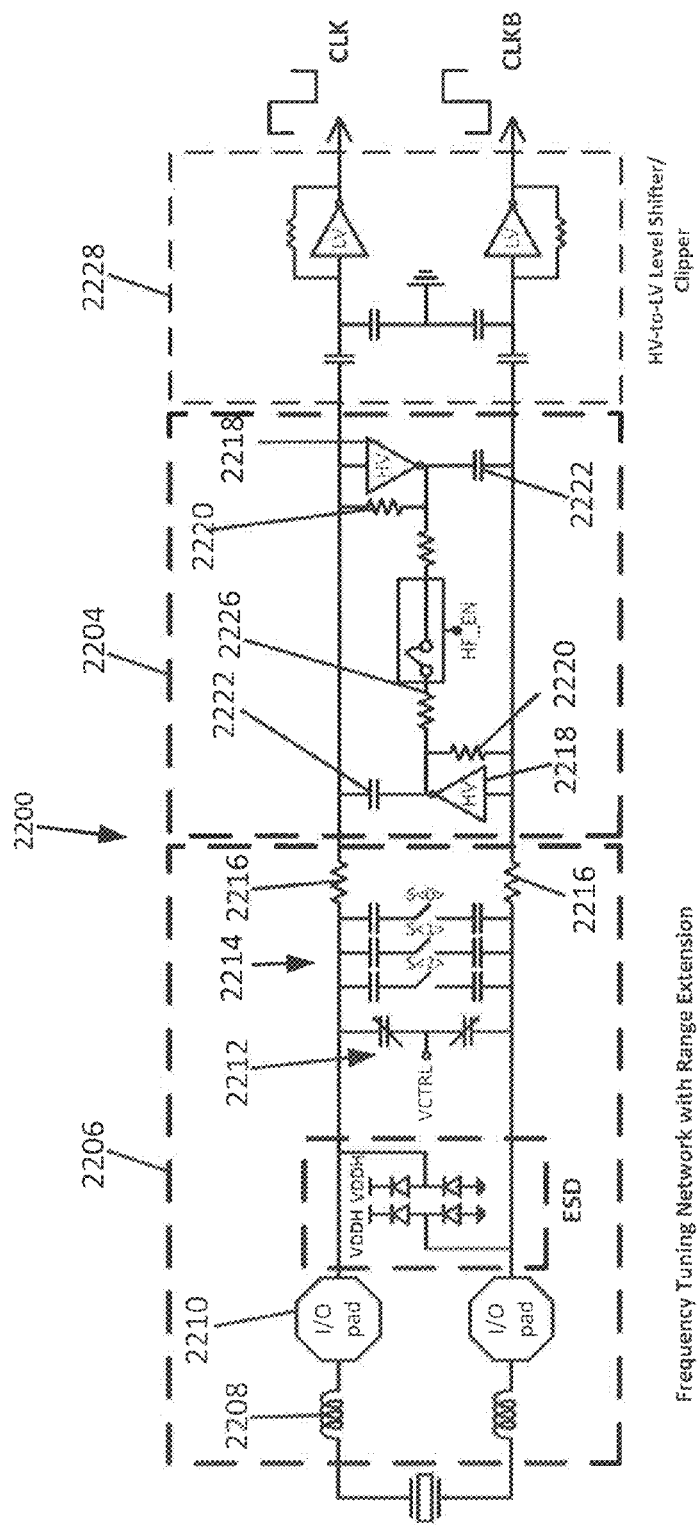
FIG. 22 shows another embodiment of an oscillator in accordance with the present disclosure.

FIG. 22 shows another embodiment of an oscillator 2200 in accordance with the present disclosure. The oscillator 2200 is similar to the oscillator 600 of FIG. 6, the difference being the oscillator 2200 comprises a level shifter 2228 connected to the oscillator driver 2204 to level shift the oscillator output signal from a high-voltage (2.5V) rail to a low-voltage (1.0V) rail. A level shifter 2228 is also known as a hard-limiting amplifier. The embodiment of the oscillator 2200 shown in FIG. 22 produces a square-wave digital signal. The oscillator 2200 may be used in, for example, a high performance clock synthesizer (local oscillator or LO) with an integrated jitter attenuator (JAT) PLL that generates low-jitter, low-phase-noise clock outputs for driving high performance data converters, RF synthesizers, serializers-deserializers, and digital signal processing subsystems. The oscillator driver 2204 may be fabricated in 65 nm CMOS process using 1-Volt and internal regulated 2.5-Volt power supplies, and Deep-NWell option for noise isolation. Rather than a level shifter 2228, the oscillator 2200 can comprise a band-pass or a tuned amplifier for generating a sinusoidal signal.

Figure 23:
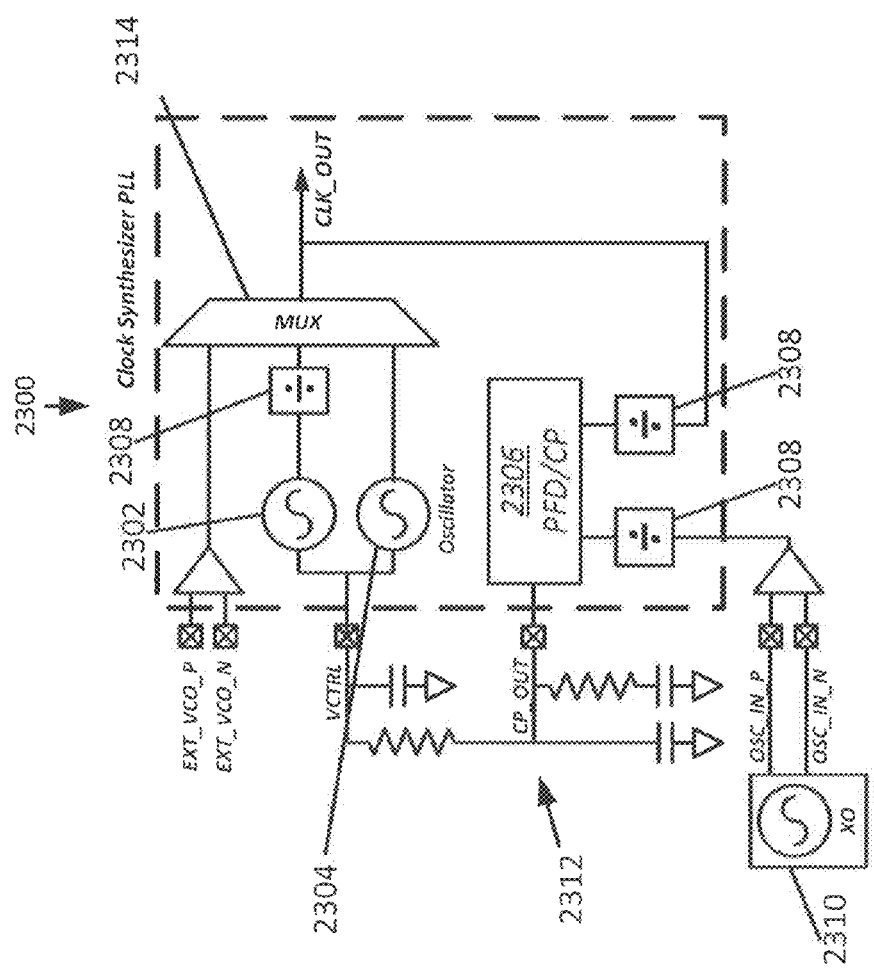
FIG. 23 shows a clock synthesizer phase-locked loop (PLL) comprising a voltage controlled oscillator in accordance with an embodiment of the present disclosure.

FIG. 23 shows a clock synthesizer phase-locked loop 2300 (PLL) comprising first 2302 and second 2304 voltage controlled oscillators. The PLL 2300 also comprises a phase-frequency detector and charge pump 2306 (PFD/CP) and clock dividers 2308. The PLL 2300 receives a reference clock signal from a crystal oscillator XO 2310. The PLL 2300 divides the reference clock signal and compares its phase and frequency to the divided-down output signal CLK_OUT using the PFD/CP 2306. A difference in the phase or frequency generates an output charge-pump signal CP_OUT. The output signal from the PFD/CP 2306 is received by a loop filter 2312. The loop filter 2312 generates a control voltage signal VCTRL. The control voltage signal VCTRL passes into the VCOs 2302, 2304. For applications that do not require a precise high frequency clock signal, a divided down signal from the first VCO 2302 is selected using a multiplexor 2314. The first VCO 2302 can be a conventional VCO with an integrated LC resonator followed by a frequency divider. For applications requiring a precise high frequency clock signal with very good phase noise performance, the second VCO 2304 is selected using the multiplexor 2314. The output signal CLK_OUT from the multiplexor 2314 is the clock signal.

Figure 24:
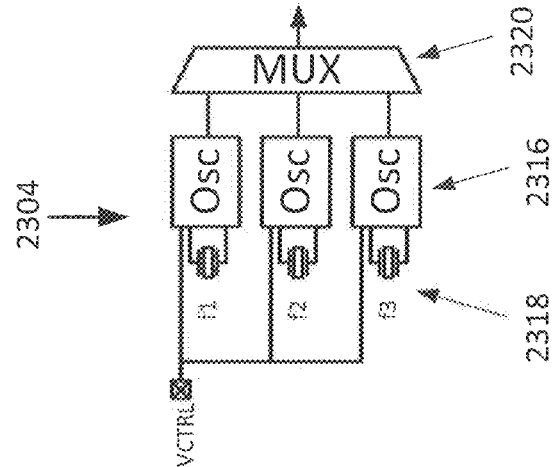
FIG. 24 shows a detailed view of a voltage controlled oscillator array of FIG. 23.

FIG. 24 shows, in greater detail, the second voltage controlled oscillator 2304 of FIG. 23. The voltage controlled oscillator 2304 comprises three tunable balanced oscillators 2316 in accordance with an embodiment of the present disclosure. In another embodiment, there is a bank of selectable oscillators some of which may be tunable. Each oscillator 2316 comprises an electro-mechanical resonator 2318 centered at a different oscillation frequency f1, f2, f3. The resonators 2318 are BAW or FBAR in miniature hermetic packages incorporated in a flip-chip (FC) or wirebond (WB) package of the clock synthesizer integrated circuit. The oscillators are connected to a multiplexor 2320, which selects which of the oscillator signals is propagated to an output. The oscillator 2316 with the most suitable frequency for the application and output frequency is selected.

Referring again to FIG. 23, the control voltage signal VCTRL continuously tunes the frequency of the selected oscillator 2302, 2304 so that a precise output frequency is generated that is unaffected by voltage and temperature drifts. The fixed capacitance in the capacitor bank is adjusted in the IC production to offset the trimming inaccuracy of the resonators 2318.

In the preceding description, for purposes of explanation, numerous details are set forth in order to provide a thorough understanding of the embodiments of the disclosure. However, it will be apparent to one skilled in the art that these specific details are not required. In other instances, well-known electrical structures and circuits are shown in block diagram form.

The above-described embodiments are intended to be examples only. Alterations, modifications, and variations may be effected to the particular embodiments by those of skill in the art without departing from the scope, which is defined solely by the claims appended hereto.

What is claimed is:

1. An oscillator for generating balanced oscillations, the oscillator comprising:
   an electro-mechanical resonator for creating oscillations in the oscillator;
   an oscillator core connected to the electro-mechanical resonator for starting and sustaining balanced oscillations in the oscillator, the oscillator core comprising
   first and second cross-coupled complementary inverters forming a loop, each inverter comprising an output;
   first and second capacitors connected in series in the loop to the outputs of the first and second cross-coupled complementary inverters, respectively, and configured to inhibit the cross-coupled complementary inverters from latching to a static direct current state when starting oscillations; and
   a resistor network connecting the output of the first inverter to the output of the second inverter for creating a high pass filter with the capacitors to inhibit relaxation-mode oscillations, the resistor network comprising a switchable connection to the outputs of the first and second inverters;
   a controller connected to the resistor network and configured to enable the switchable connection when starting the oscillations to create the high pass filter with the capacitors to inhibit relaxation-mode oscillations, and to disable the switchable connection in response to balanced oscillations in the oscillator at steady state to reduce phase noise and increase the amplitude of the balanced oscillations.

2. The oscillator of claim 1, wherein the first and second capacitors are connected in series in the loop to outputs of the first and second cross-coupled complementary inverters, respectively, to break a positive feedback loop at DC between the cross-coupled complementary inverters.

3. The oscillator of claim 1, wherein the controller disables the switchable connection when steady-state gain at the balanced oscillation frequency is at unity gain and gain at the relaxation frequency is less than unity gain.

4. The oscillator of claim 1, wherein the inverters each comprise an NMOS transistor and a PMOS transistor connected to each other at their drains, the oscillator further comprising an electronic element connected to a source of each NMOS transistor for varying the amplitude of, and reducing phase noise in the balanced oscillations, wherein the electronic element is at least one of a current source, a resistor, a variable resistor, and an array of switchable transistors.

5. The oscillator of claim 1, wherein the inverters each comprise an NMOS transistor and a PMOS transistor connected to each other at their drains, the oscillator further comprising an electronic element connected to a source of each of the PMOS transistors for varying the amplitude of, and reducing phase noise in the balanced oscillations, wherein the electronic element is at least one of a current source, a resistor, a variable resistor, and an array of switchable transistors.

6. The oscillator of claim 1, further comprising a differential output connected to the resonator for outputting the balanced oscillations as a differential pair of signals.

7. The oscillator of claim 6, wherein the output comprises a pair of hard-limiters to convert the oscillations to digital electronic signals and output balanced complementary digital signals.

8. The oscillator of claim 6, wherein the output comprises one of a band-pass filter and a tuned amplifier configured to output a pure differential sinusoidal pair of signals.

9. The oscillator of claim 1, further comprising first and second self-biasing feedback resistors connected in parallel with the first and second inverters, respectively, to bias the first and second inverters at maximum small-signal gain operating point such that the oscillator experiences maximum loop gain to start balanced oscillations.

10. The oscillator of claim 1, wherein the balanced oscillations have a frequency, the oscillator further comprising a frequency tuning network connected to the electro-mechanical resonator for tuning the frequency of the balanced oscillations.

11. The oscillator of claim 10, wherein the frequency tuning network comprises: a capacitor network having one or more switchable capacitors connected to the resonator; and a second controller for enabling the switchable capacitor connection to decrease the frequency of the balanced oscillations in the oscillator, and for disabling the switchable capacitor connection to increase the frequency of the balanced oscillations in the oscillator.

12. The oscillator of claim 11, wherein the capacitor network comprises switched capacitors and a voltage-controlled variable capacitor.

13. The oscillator of claim 10, wherein the frequency tuning network comprises an inductor in series with each terminal of the electro-mechanical resonator for increasing the inductance in the oscillator to reduce the amount of capacitance needed to achieve a lower limit frequency of balanced oscillations, while maintaining the amount of capacitance needed to achieve an upper limit frequency of balanced oscillations.

14. The oscillator of claim 13, wherein the frequency tuning network further comprises a resistor connected to the electro-mechanical resonator for delaying the phase of balanced oscillations at a desired frequency to inhibit the balanced oscillations from occurring at an undesired frequency.

15. The oscillator of claim 1, wherein
the resistor network comprises a first resistor and a second resistor connecting the output of the first cross-coupled complementary inverter to the output of the second cross-coupled complementary inverter, respectively; and
the switchable connection comprises first and second switches connected to the first and second resistors, respectively, the first and second switches for connecting the first and second resistors in series when the switches are enabled.

16. An electronic system-in-package (SiP) for generating balanced oscillations, the system-in-package comprising:
an electro-mechanical resonator for creating oscillations in the oscillator;
a frequency tuning network for tuning a frequency of the balanced oscillations;
an embedded device-in-package comprising a pair of inductors for connecting the frequency tuning network in parallel with the electro-mechanical resonator;
an oscillator core on a semiconductor die connected to both the frequency tuning network and electro-mechanical resonator in parallel for starting and sustaining balanced oscillations in the system-in-package, the oscillator core comprising
first and second cross-coupled complementary inverters forming a loop, each inverter comprising an output;
first and second capacitors connected in series in the loop to the outputs of the first and second cross-coupled complementary inverters, respectively, and configured to inhibit the cross-coupled complementary inverters from latching to a static direct current state when starting oscillations; and
a resistor network connecting the output of the first inverter to the output of the second inverter for creating a high pass filter with the capacitors to inhibit relaxation-mode oscillations.

17. The electronic SiP of claim 16, wherein the resistor network comprises a switchable connection to the outputs of the first and second inverters, the electronic SiP further comprising a controller connected to the resistor network and configured to enable the switchable connection when starting the oscillations to create a high pass filter with the capacitors to inhibit relaxation-mode oscillations, and to disable the switchable connection in response to balanced oscillations in the oscillator at steady state to reduce phase noise and increase the amplitude of the balanced oscillations.

18. A method for generating balanced oscillations in an oscillator, comprising:
starting the oscillator using an electro-mechanical resonator and an oscillator core;
inhibiting the oscillator from latching to a static direct current state using a capacitance in the oscillator core;
inhibiting relaxation oscillations in the oscillator using a high pass filter, wherein inhibiting relaxation oscillations comprises enabling a resistor network to create the high pass filter with the capacitance to inhibit relaxation oscillations in the oscillator; and
in response to balanced oscillations in the oscillator at steady state, disabling the resistor network to disable the high pass filter in the oscillator core to reduce phase noise and increase the amplitude of the balanced oscillations.

19. The method of claim 18, wherein the resistor network is disabled to disconnect the high pass filter from the oscillator core when oscillator loop gain at the balanced oscillation frequency is unity gain and gain at any other frequency is less than unity gain.

20. The method of claim 18, further comprising outputting the balanced oscillations as a signal.

21. The method of claim 20, wherein outputting the signal comprises outputting balanced complementary digital signals.

22. The method of claim 20, wherein outputting the signal comprises outputting balanced differential sinusoidal pair of signals.

23. The method of claim 18, wherein activating and deactivating a switch connects and disconnects the resistor network from the oscillator core, respectively.

24. The method of claim 18, wherein the balance oscillations have a frequency and tuning the frequency of the balanced oscillations in the oscillator comprises varying the capacitance in the oscillator.

25. The method of claim 24, further comprising tuning the frequency of the balanced oscillations in the oscillator based on a selected inductance in the oscillator.

\* \* \* \* \*